United States Patent
Okajima et al.

(10) Patent No.: US 8,071,882 B2
(45) Date of Patent: Dec. 6, 2011

(54) METAL BASE CIRCUIT BOARD, LED, AND LED LIGHT SOURCE UNIT

(75) Inventors: Yoshihiko Okajima, Shibukawa (JP); Katsunori Yashima, Shibukawa (JP); Keiji Takano, Shibukawa (JP); Takuya Okada, Shibukawa (JP)

(73) Assignee: Denki Kagaku Kogyo Kabushiki Kaisha, Toyko (JP)

( * ) Notice: Subject to any disclaimer, the term of this patent is extended or adjusted under 35 U.S.C. 154(b) by 999 days.

(21) Appl. No.: 11/911,914

(22) PCT Filed: Apr. 19, 2006

(86) PCT No.: PCT/JP2006/308221
§ 371 (c)(1),
(2), (4) Date: Oct. 18, 2007

(87) PCT Pub. No.: WO2006/112478
PCT Pub. Date: Oct. 26, 2006

(65) Prior Publication Data
US 2009/0032295 A1 Feb. 5, 2009

(30) Foreign Application Priority Data

Apr. 19, 2005 (JP) ................. 2005-120891
Jan. 23, 2006 (JP) ................. 2006-013289
Feb. 7, 2006 (JP) ................. 2006-030024
Mar. 28, 2006 (JP) ................. 2006-087688

(51) Int. Cl.
*H05K 1/03* (2006.01)
(52) U.S. Cl. ......... 174/250; 174/255; 174/254; 174/260

(58) Field of Classification Search ........... 174/250–268
See application file for complete search history.

(56) References Cited

U.S. PATENT DOCUMENTS 4,113,981 A * 9/1978 Fujita et al. ................. 174/88 R
(Continued)

FOREIGN PATENT DOCUMENTS
CN 1466782 A 1/2004
(Continued)

OTHER PUBLICATIONS

U.S. Appl. No. 12/525,166, filed Jul. 30, 2009, Yashima, et al.
(Continued)

*Primary Examiner* — Angel R Estrada
*Assistant Examiner* — Dimary Lopez
(74) *Attorney, Agent, or Firm* — Oblon, Spivak, McClelland, Maier & Neustadt, L.L.P.

(57) ABSTRACT

To provide a thin metal base circuit board which can be not only installed on a flat portion but also closely attached to a side or bottom surface of a case or to a stepped or curved portion and which is excellent in heat dissipation performance, electrical insulating performance and flexibility; a process for its production; and a hybrid integrated circuit, an LED module and a bright, ultra-long-life LED light source employing it. A metal base circuit board having insulating layers and conductive circuits or metal foils alternately laminated, characterized in that the thickness of each conductive circuit or metal foil is from 5 μm to 450 μm, each insulating layer is made of a cured product of a resin composition comprising an inorganic filler and a thermosetting resin, and the thickness of each insulating layer is from 9 μm to 300 μm; and a hybrid circuit board employing it.

24 Claims, 9 Drawing Sheets

U.S. PATENT DOCUMENTS

| | | | | |
|---|---|---|---|---|
| 4,533,719 | A | * | 8/1985 | Waddill .................... 528/111 |
| 4,617,357 | A | | 10/1986 | Pallie et al. |
| 5,098,965 | A | | 3/1992 | Bauer et al. |
| 5,473,118 | A | * | 12/1995 | Fukutake et al. ............. 174/258 |
| 5,777,275 | A | * | 7/1998 | Mizutani et al. ............. 174/254 |
| 5,840,417 | A | * | 11/1998 | Bolger ...................... 428/323 |
| 5,849,396 | A | | 12/1998 | Ali et al. |
| 5,917,157 | A | * | 6/1999 | Remsburg .................... 174/252 |
| 5,948,514 | A | * | 9/1999 | Komori et al. ............... 428/209 |
| 6,207,296 | B1 | * | 3/2001 | Higuchi et al. .............. 428/620 |
| 6,284,829 | B1 | | 9/2001 | Dalbe et al. |
| 6,818,263 | B2 | * | 11/2004 | Shimodaira et al. ........... 428/1.6 |
| 6,967,439 | B2 | * | 11/2005 | Cok et al. .................. 313/512 |
| 7,423,219 | B2 | * | 9/2008 | Kawaguchi et al. ............ 174/254 |
| 7,858,153 | B2 | * | 12/2010 | Kato et al. ................. 427/470 |
| 2002/0130985 | A1 | * | 9/2002 | Weindorf et al. ............. 349/61 |
| 2002/0162685 | A1 | * | 11/2002 | Gotro et al. ................ 174/258 |
| 2003/0056978 | A1 | * | 3/2003 | Terunuma et al. ............. 174/254 |
| 2003/0152808 | A1 | * | 8/2003 | Noguchi et al. .............. 428/694 TP |
| 2005/0012652 | A1 | * | 1/2005 | Wakayama et al. ............. 342/1 |
| 2007/0237949 | A1 | * | 10/2007 | Nonaka et al. ............... 428/343 |

FOREIGN PATENT DOCUMENTS

| | | | |
|---|---|---|---|
| JP | 2005 64168 | | 3/2005 |
| JP | 2005064168 A | * | 3/2005 |
| WO | WO 92/22422 | * | 12/1992 |

OTHER PUBLICATIONS

European Office Action in European Application No. 06 745 453.8-1 232 dated Aug. 26, 2011.

R. Cuthrell, "Epoxy Polymers V. Dielectric Strength", Journal of Applied Polymer Science, vol. 16, Jan. 1, 1972, pp. 1983-1996, XP007919249.

* cited by examiner

METAL BASE CIRCUIT BOARD, LED, AND LED LIGHT SOURCE UNIT

TECHNICAL FIELD

The present invention relates to a metal base circuit board which can be bent with excellent electromagnetic wave-shielding performance while securing heat dissipation performance and electrical insulating performance, and a light-emitting diode (LED) and LED light source unit employing it. Particularly, it relates to a LED light source unit suitable for a backlight of a liquid crystal display device.

BACKGROUND ART

In recent years, circuit boards for mounting semiconductors are required to have the boards small-sized and to accomplish high density mounting and high performance. Further, it has been a problem how to dissipate the heat generated from e.g. semiconductor elements in a narrow space limited by small-sizing or high power of e.g. the semiconductor elements. Particularly, a metal base circuit board having a circuit formed by bonding a metal foil via an insulating layer on a metal plate has been commonly employed for the reason that it is excellent in heat dissipation performance mainly in the electric power source field or the automobile electric installation field.

However, in a metal base circuit board, the thickness of the base board is usually from 1.0 mm to 3.0 mm, whereby it is difficult to reduce the thickness, and the installation site is rather limited. Further, it has a structure formed via a thin insulating layer on a metal plate, whereby there has been a problem such that noises are likely to occur, or malfunction of a module is likely to occur.

In order to shield noises or to increase the heat dissipation performance, a metal base multilayer board is, for example, known wherein an upper layer circuit board having a circuit is laminated, via an adhesive agent, on is the entire surface or a part of the surface of a metal base circuit board (Patent Document 1).

In such a construction, an adhesive layer poor in the heat conductivity is present between the metal plate and the upper layer board, and in a case where a high power element is mounted on the upper layer circuit pattern, the heat dissipation performance tends to be inadequate, and the temperature of the element tends to rise, thus leading to a problem of malfunction.

In order to solve such a problem of heat dissipation performance, a metal base circuit board having a highly heat conductive insulating layer is known (Patent Document 2).

However, the metal plate was thick and could not be installed as attached along the shape of a case such as a case having a curved surface, and thus the heat dissipation performance of the insulating layer could not be sufficiently utilized. Besides, a large space was required for its installation, since it could not be installed in a bent form, and there was a problem such that the module could not be small-sized.

On the other hand, a metal base circuit board having an insulating layer made of e.g. an epoxy resin containing an inorganic filler formed on a metal plate, and having a circuit pattern formed thereon, is excellent in heat dissipation performance and electrical insulating performance and thus is used as a circuit board for an electronic equipment for e.g. automobiles and communication instruments having highly heat generating electronic components mounted (Patent Document 3).

If a metal base circuit board can be optionally bent, the limitation in the installation site which used to be limited to installation on a flat portion, will be relaxed, and it will be possible to adhere, bond or closely attach by e.g. a screw it to a side or bottom surface or to a stepped or curved surface of a case, whereby an electronic equipment having a highly heat generating electronic component mounted, can be small-sized. Further, if a metal base circuit board itself can be made thin, it can be inserted or fixed in a narrow space, whereby an electronic equipment having a highly heat generating electronic component mounted, can be made thin.

It has been proposed that by a method of heating a metal base circuit board at a high temperature of at least 120° C., i.e. by carrying out bending or drawing in such a state that the metal base circuit board is heated at a temperature higher by at least 10° C. than the glass transition temperature (Tg) of the insulating layer, the metal base circuit board having a non-flat portion is used also as a case or an electronic circuit package (Patent Document 4).

Further, a light-emitting diode (LED) light source unit using a light-emitting diode (LED) as a light source, has been used in various fields, but, for example, in a light source for backlight of a liquid crystal display device, it has been common to use a small size fluorescent tube so-called CFL (compact fluorescent lamp).

The light source of the above CFL (compact fluorescent lamp) adopts a construction such that Hg (mercury) is sealed in a discharge tube, and ultraviolet rays discharged from mercury excited by electrical discharge will impinge on the phosphor on the tube wall of CFL (compact fluorescent lamp) and will be converted to visible light. Therefore, recently, from the viewpoint of the environment protection, it has been desired to use a substitute light source not using hazardous mercury.

As a new light source, one using a light-emitting diode (hereinafter referred to simply as "LED") has been proposed. With LED, the light has directional characteristics, and particularly with a surface mounting type on e.g. a flexible board, the light will be taken out in one direction, and as different from a structure using conventional CFL (compact fluorescent lamp), the light loss is small, and thus, it is used as a light source for backlight in a planar light source system (Patent Document 5).

The backlight using LED as a light source is now being widely used as backlight of a liquid crystal display device along with reduction of the price, improvement in the luminous efficiency and environmental regulations. At the same time, along with the higher brightness of a liquid crystal display device and enlargement of the display area, the increase in number of LED mounted on e.g. a flexible board and the trend for higher output are in progress in order to improve the luminescence.

However, the light source of LED has low luminance efficiency, and majority of the input power to illuminate LED will be discharged as heat. When an electric current is conducted, LED generates heat and becomes to have a high temperature due to the generated heat, and in an extreme case, LED will be destroyed. Also in a backlight using LED as a power source, such generated heat will be accumulated in LED and the board having LED mounted, and along with the increase of the temperature of LED, the luminance efficiency of LED itself tends to deteriorate. Besides, if it is attempted to increase the number of LED to be mounted or to increase the input power in order to make the backlight bright, the heat generation will further increase, and it is therefore important to remove such heat.

In order to reduce the heat accumulation in the LED-mounted board and to reduce the temperature rise of a LED chip, it has been proposed that a metal film having a LED chip mounted on a LED chip-mounted surface of a LED-mounted board, a metal drive wiring to supply a drive current to the LED chip and a metal film pattern intended for heat dissipation, are formed, a metal film for heat dissipation is formed on a surface facing the LED chip-mounted surface, and a metal through-hole is formed in a thickness direction of the LED chip-mounted board to connect the metal pattern on one main surface side to the metal film for heat dissipation on the other main surface side, so that heat generation from LED is dissipated through the metal through-hole to the rear side metal film (Patent Document 6).

However, in a case where the shape of LED to be mounted is small, the area of the mounted metal film will be limited, and the number of metal through-holes which can be formed immediately beneath LED will be limited, and in a case where a metal film pattern can not be formed on the mounted board from the restriction of the board area, there will be a problem such that the heat generated by LED can not efficiently be released to the rear side of the board.

Further, if a metal base circuit board using a metal base plate having a thickness of 2 mm is used instead of the flexible board, good heat dissipation can be obtained without necessity to provide metal through-holes, but there will be a problem that the thickness of the board tends to be thick, and it will be necessary to enlarge the size for punching out from e.g. an electrode and a circuit pattern over the flexible board, whereby the board area is obliged to be large. Further, it is not possible to optionally bend a portion other than the LED-mounted portion, whereby e.g. the position to form an input terminal will be restricted.

Besides, if the thickness of the metal base of the metal base circuit board is made thin to have such a structure that the size for punching out from e.g. an electrode and a circuit pattern is made small like a flexible board, even when the metal base circuit board is slightly bent, the insulating layer will have cracking and become useless. Likewise, there has been a problem that the LED-mounted portion can not be optionally bent.

Further, a metal base circuit board using a metal foil of from about 9 to 40 μm having a conductive circuit provided via an insulating layer containing a heat conductive filler and having heat dissipation performance and good bendability at room temperature, instead of a conventional polyimide type insulating layer, has been developed, since it can be used as being bent at room temperature and has bending processability.

However, if the conductive circuit was bent at an angle of 90° with a very small radius of curvature of at most 0.5 mm, the insulating layer at the bent portion was likely to have cracking and become useless. Therefore, if it was reinforced with a coverlay having an epoxy adhesive layer formed on a polyimide film, it was possible to prevent cracking in the insulating layer at the bent portion, but the bendability decreased, and there was a problem that it became difficult to bend it at an angle of at least 90° with a very small radius of curvature of at most 0.5 mm.

Further, in a case where a circuit board for mounting a semiconductor or a small size precision motor is, for example, mounted, there has been a problem that noises are likely to occur, or malfunction of a module is likely to occur.

Patent Document 1: JP-A-05-037169
Patent Document 2: JP-A-09-139580
Patent Document 3: JP-A-62-271442
Patent Document 4: JP-A-2001-160664
Patent Document 5: JP-A-2005-293925
Patent Document 6: JP-A-2005-283852

DISCLOSURE OF THE INVENTION

Object to be Accomplished by the Invention

The present invention has been made to solve the above problems of the prior art, and it is an object of the present invention to provide a metal base circuit board which has good heat dissipation performance and good bendability and is excellent also in electromagnetic shielding performance and electrical insulating performance; a process for its production; and a hybrid integrated circuit, an LED module reinforced by a coverlay, and a bright long-life LED light source unit where damage of LED is prevented.

Means to Accomplish the Object

Namely, the present invention provides the following:
(1) A metal base circuit board having an insulating layer and a conductive circuit or metal foil alternately laminated, characterized in that the thickness of the conductive circuit or metal foil is from 5 μm to 450 μm, the insulating layer is made of a cured product of a resin composition comprising an inorganic filler and a thermosetting resin, and the thickness of the insulating layer is from 9 μm to 300 μm.
(2) The metal base circuit board according to the above (1), wherein at least one through-hole to be used for electrically connecting conductive circuits or metal foils, is at least 0.0078 mm².
(3) The metal base circuit board according to the above (1) or (2), wherein the thermal conductivity of the insulating layer is from 1 to 4 W/mK.
(4) The metal base circuit board according to any one of the above (1) to (3), wherein the glass transition temperature of the insulating layer is from 0 to 40° C.
(5) The metal base circuit board according to any one of the above (1) to (4), wherein the insulating layer is a cured product of a resin composition comprising from 25 to 60 vol % of a thermosetting resin and the rest being an inorganic filler having a sodium ion concentration of at most 500 ppm and comprising spherical coarse particles having the maximum particle size of at most 75 μm and an average particle size of from 5 to 40 μm and spherical fine particles having an average particle size of from 0.3 to 3.0 μm.
(6) The metal base circuit board according to any one of the above (1) to (5), wherein the thermosetting resin comprises a hydrogenated bisphenol F and/or A epoxy resin.
(7) The metal base circuit board according to the above (6), wherein the thermosetting resin comprises a straight-chain epoxy resin having an epoxy equivalent of from 800 to 4,000.
(8) The metal base circuit board according to the above (6) or (7), wherein the thermosetting resin contains a polyoxyalkylene polyamine as a curing agent.
(9) The metal base circuit board according to any one of the above (6) to (8), wherein the chloride ion concentration in the thermosetting resin is at most 500 ppm.
(10) The metal base circuit board according to any one of the above (1) to (9), wherein when the circuit board is bent at an optional portion at an angle of at least 90° with a radius of curvature of from 1 to 5 mm, the withstand voltage between conductive circuits or metal foils is at least 1.0 kV.
(11) The metal base circuit board according to any one of the above (1) to (10), wherein a conductive circuit is formed on a metal foil via an insulating layer, and a coverlay having a thickness of from 5 μm to 25 μm is further formed, and wherein at least a part of the coverlay is removed to form a slit at a portion where the conductive circuit is not formed.

(12) The metal base circuit board according to the above (11), wherein the slit is formed to have a length corresponding to from 50% to 95% of the length of the portion to be bent.

(13) The metal base circuit board according to the above (11) or (12), wherein the thickness of the coverlay is from 5 μm to 25 μm.

(14) The metal base circuit board according to any one of the above (11) to (13), which is bent along the slit.

(15) The metal base circuit board according to any one of the above (11) to (14), wherein the insulating layer surface is bent at an angle of at least 90° with a radius of curvature of from 0.1 to 0.5 mm.

(16) The metal base circuit board according to any one of the above (11) to (15), wherein a layer having a magnetic loss or a layer having a dielectric loss is laminated on the surface of the coverlay.

(17) The metal base circuit board according to any one of the above (11) to (16), wherein the layer having a magnetic loss comprises a magnetic material having an aspect ratio of at least 2, and an organic binder, the content of the magnetic material is from 30 to 70 vol %, and the thickness of the layer having a magnetic loss is from 3 μm to 50 μm.

(18) The metal base circuit board according to any one of the above (11) to (16), wherein the layer having a dielectric loss comprises a carbon powder having a specific surface area of from 20 to 110 m$^2$/g, and an organic binder, the content of the carbon powder is from 5 to 60 vol %, and the thickness of the layer having a dielectric loss is from 3 μm to 50 μm.

(19) A hybrid integrated circuit using the metal base circuit board as defined in any one of the above (1) to (10).

(20) A light-emitting diode having at least one light-emitting diode electrically connected to the conductive circuit of the metal base circuit board as defined in any one of the above (11) to (18).

(21) A LED light source unit having the metal base circuit board as defined in any one of the above (1) to (18) disposed on a surface of a case via an adhesive tape and having at least one light-emitting diode (LED) mounted on the conductive circuit of the metal base circuit board.

(22) The LED light source unit according to the above (21), wherein the adhesive tape has a thermal conductivity of from 1 to 2 W/mK and a thickness of from 50 μm to 150 μm.

(23) The LED light source unit according to the above (21) or (22) wherein the adhesive tape comprises a polymer comprising acrylic acid and/or methacrylic acid.

(24) The LED light source unit according to any one of the above (21) to (23), wherein the adhesive tape contains a heat-conductive electrically insulating agent in an amount of from 40 to 80 vol %.

(25) The LED light source unit according to any one of the above (21) to (24), wherein the heat-conductive electrically insulating agent has the maximum particle size of at most 45 μm and an average particle size of from 0.5 to 30 μm.

Effects of the Invention

The metal base circuit board of the present invention has electromagnetic shielding performance, heat dissipation performance and electrical insulating performance and yet is bendable at room temperature, whereby it can be not only installed on a flat portion but also closely attached to a side or bottom surface of a case or to a stepped or curved portion. Further, it can be easily bent at room temperature in such a state that an electrical component such as a semiconductor element or resistant chip required to have heat dissipated, is mounted, whereby it is possible to reduce the size or thickness of an electronic equipment having a highly heat generating electronic component mounted, which used to be difficult to accomplish.

Further, it is now possible that the heat generated from the LED light source is dissipated to the rear side of the board and released to the exterior via a heat conductive adhesive tape, whereby it is possible to reduce the heat accumulation in the LED-mounted board and to reduce the temperature rise of LED. Thus, it is possible to suppress the deterioration of the luminance efficiency of LED, to prevent a damage of LED and to provide a bright, long-life LED light source unit.

BRIEF DESCRIPTION OF DRAWINGS

FIG. 2-1 is a plan view illustrating an example of a metal base circuit board according to the present invention.

FIG. 2-2 is a plan view illustrating an example of a metal base circuit board according to the present invention (one having a coverlay disposed on the surface of FIG. 2-1).

FIG. 2-3 is a plan view illustrating an example of a metal base circuit board according to the present invention (one having a layer having a magnetic loss or a layer having a dielectric loss disposed on the surface of FIG. 2-2).

FIG. 2-4 is a plan view illustrating an example of a metal base circuit board according to the present invention (one having a heat generating component disposed on the surface of FIG. 2-3).

FIG. 2-5 is a cross-sectional view of another metal base circuit board according to the present invention.

FIG. 2-6 is a plan view of another metal base circuit board according to the present invention.

FIG. 2-7 is a plan view of another metal base circuit board according to the present invention.

FIG. 3-1 is a cross-sectional view illustrating an example of a LED light source unit according to the present invention.

MEANINGS OF REFERENCE SYMBOLS

Figure 1:
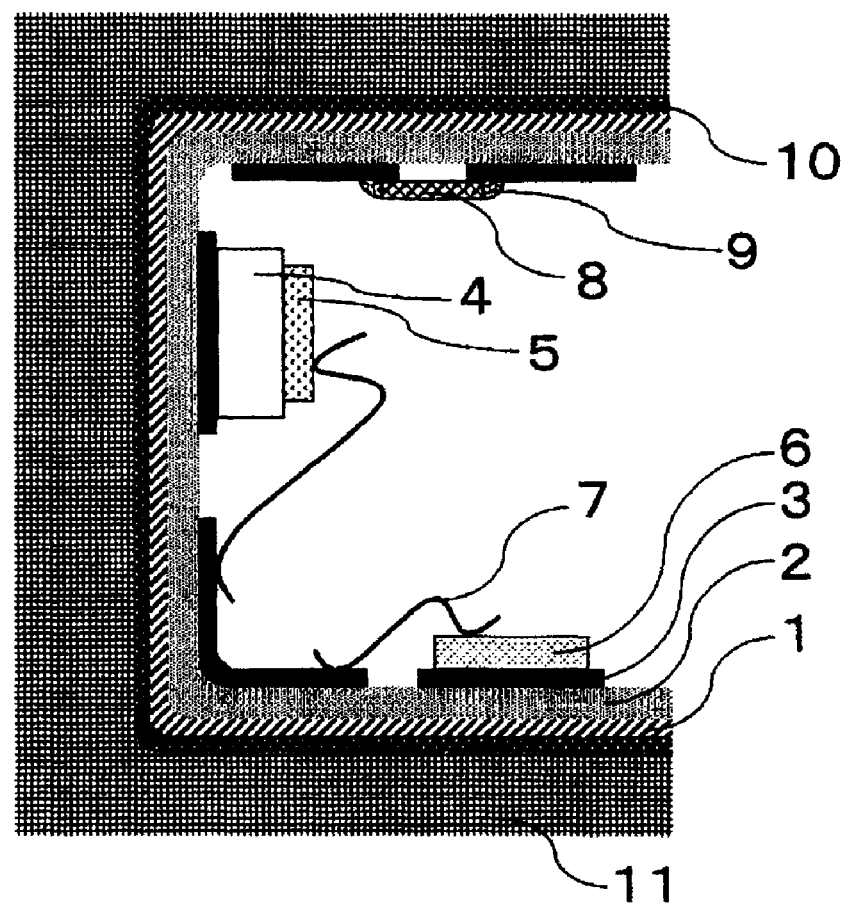
FIG. 1-1 is a view illustrating one embodiment of a hybrid integrated circuit employing a metal base circuit board of the present invention.

1: Metal foil, 2: Insulating layer, 3: Conductive circuit, 4: Heat spreader, 5: Power semiconductor, 6: Control semiconductor, 7: Bonding wire, 8: Chip component, 9: Solder joint portion, 10: Heat conductive adhesive, 11: Case having heat dissipation performance, 21: Metal foil, 22: Insulating layer, 23: Conductive circuit, 24: Electrode, 25: Slit portion, 26: Coverlay, 26a: Epoxy adhesive layer, 27: Component-mounted portion, 28: Input terminal, 29a: Layer having a magnetic loss, 29b: Layer having a dielectric loss, 210: Heat generating component (LED), 211: Bending portion, 212: Case, 213: Heat conductive adhesive tape, 31: Metal foil, 32: Insulating layer, 33: Conductive circuit, 34: Input circuit (lead wiring), 35: Solder joint portion, 36: LED, 37: Heat conductive adhesive tape, 38: Case

BEST MODE FOR CARRYING OUT THE INVENTION

Preferred embodiments of the metal base circuit board, hybrid integrated circuit, LED module and LED light source unit of the present invention are as follows.

(1-1) A metal base circuit board having a conductive circuit formed via an insulating layer on a metal foil, wherein the thickness of the metal foil is from 5 μm to 300 μm, and the thickness of the insulating layer containing an inorganic filler and a thermosetting resin is from 80 μm to 200 μm, and the thickness of the conductive circuit is from 9 μm to 140 μm.

(1-2) The metal base circuit board according to (1-1) wherein the thermosetting resin contains a hydrogenated bisphenol F and/or A epoxy resin.

(1-3) The metal base circuit board according to (1-2) wherein the thermosetting resin contains a straight-chain high molecular weight epoxy resin having an epoxy equivalent of from 800 to 4,000.

(1-4) The metal base circuit board according to any one of (1-1) to (1-3) wherein the chloride ion concentration in the thermosetting resin is at most 500 ppm.

(1-5) The metal base circuit board according to any one of (1-1) to (1-4) wherein the glass transition temperature of the insulating layer is from 0 to 40° C.

(1-6) The metal base circuit board according to any one of (1-1) to (1-5) wherein the insulating layer contains a thermosetting resin in an amount of from 25 to 50 vol %, and the rest is an inorganic filler comprising spherical coarse particles having a maximum particle size of at most 75 μm and an average particle size of from 10 to 40 μm and spherical fine particles having an average particle size of from 0.4 to 1.2 μm, and having a sodium ion concentration of at most 500 ppm.

(1-7) The metal base circuit board according to any one of (1-1) to (1-6), which is bent to the conductive circuit side or to the side opposite to the conductive circuit side.

(1-8) The metal base circuit board according to any one of (1-1) to (1-6) which is bent to the conductive circuit side or to the side opposite to the conductive circuit side at an angle of at least 90° with a radius of curvature of from 1 to 5 mm.

(1-9) The metal base circuit board according to any one of (1-1) to (1-6) wherein the heat conductivity of the insulating layer is from 1 to 4 W/mK, and the withstand voltage between the conductive circuit and the metal foil in a state bent at an angle of at least 90° with a radius of curvature of from 1 to 5 mm is at least 1.5 kV.

(1-10) A process for producing the metal base circuit board as defined in any one of (1-7) to (1-9) which is characterized by bending at room temperature.

(1-11) A hybrid integrated circuit using the metal base circuit board as defined in any one of (1-1) to (1-9).

(2-1) A circuit board having an insulating layer and a conductive circuit or metal foil alternately laminated, characterized in that the thickness of the conductive circuit or metal foil is from 5 μm to 450 μm, the insulating layer is made of a cured product of a resin composition comprising an inorganic filler and a thermosetting resin, and the thickness of the insulating layer is from 9 μm to 300 μm.

(2-2) The circuit board according to (2-1), wherein at least one through-hole to be used for electrically connecting conductive circuits or metal foils, is at least 0.0078 mm$^2$.

(2-3) The circuit board according to (2-1) or (2-2), wherein the thermal conductivity of the insulating layer is from 1 to 4 W/mK.

(2-4) The circuit board according to any one of (2-1) to (2-3), wherein the glass transition temperature of the insulating layer is from 0 to 40° C.

(2-5) The circuit board according to any one of (2-1) to (2-4), wherein the insulating layer is a cured product of a resin composition comprising from 25 to 60 vol % of a thermosetting resin and the rest being an inorganic filler comprising spherical coarse particles having the maximum particle size of at most 75 μm and an average particle size of from 5 to 40 μm and spherical fine particles having an average particle size of from 0.3 to 3.0 μm.

(2-6) The circuit board according to any one of (2-1) to (2-5), wherein when the circuit board is bent at an optional portion at an angle of at least 90° with a radius of curvature of from 1 to 5 mm, the withstand voltage between conductive circuits or metal foils is at least 1.0 kV.

(3-1) A metal base circuit board, wherein a conductive circuit is formed on a metal foil via an insulating layer, and a coverlay is further formed, and wherein at least a part of the coverlay is removed to form a slit at a portion where the conductive circuit is not formed.

(3-2) The metal base circuit board according to (3-1), wherein the slit is formed to have a length corresponding to from 50% to 95% of the length of the portion to be bent.

(3-3) The metal base circuit board according to (3-1) or (3-2) wherein the insulating layer is made of a cured resin containing an inorganic filler, the thickness of the insulating layer is from 30 μm to 80 μm, the thickness of the metal foil is from 5 μm to 40 μm, and the thickness of the conductive circuit is from 9 μm to 40 μm.

(3-4) The metal base circuit board according to any one of (3-1) to (3-3) wherein the insulating layer comprises from 50 to 75 vol % of an inorganic filler having a sodium is ion concentration of at most 500 ppm and comprising spherical particles having a maximum particle size of at most 30 μm and an average particle size of from 2 to 15 μm, and the rest being a thermosetting resin.

(3-5) The metal base circuit board according to any one of (3-1) to (3-4), wherein the thermosetting resin comprises a hydrogenated bisphenol F and/or A epoxy resin.

(3-6) The metal base circuit board according to any one of (3-1) to (3-5), wherein the thermosetting resin comprises a straight-chain high molecular weight epoxy resin having an epoxy equivalent of from 800 to 4,000.

(3-7) The metal base circuit board according to any one of (3-1) to (3-6), wherein the chloride ion concentration in the thermosetting resin is at most 500 ppm.

(3-8) The metal base circuit board according to any one of (3-1) to (3-7), wherein the glass transition temperature of the insulating layer is from 0 to 40° C.

(3-9) The metal base circuit board according to any one of (3-1) to (3-8) wherein the thickness of the coverlay is from 5 μm to 25 μm.

(3-10) The metal base circuit board according to any one of (3-1) to (3-9), which is bent along the slit portion.

(3-11) The metal base circuit board according to any one of (3-1) to (3-10), wherein the insulating layer surface is bent at an angle of at least 90° with a radius of curvature of from 0.1 to 0.5 mm.

(3-12) The metal base circuit board according to any one of (3-1) to (3-11), wherein a layer having a magnetic loss or a layer having a dielectric loss is laminated on the surface of the coverlay.

(3-13) The metal base circuit board according to (3-12), wherein the layer having a magnetic loss comprises a magnetic material having an aspect ratio of at least 2, and an organic binder, the content of the magnetic material is from 30 to 70 vol %, and the thickness of the layer having a magnetic loss is from 3 μm to 50 μm.

(3-14) The metal base circuit board according to (3-12), wherein the layer having a dielectric loss comprises a carbon powder having a specific surface area of from 20 to 110 m$^2$/g, and an organic binder, the content of the carbon powder is from 5 to 60 vol %, and the thickness of the layer having a dielectric loss is from 3 μm to 50 μm.

(3-15) The metal base circuit board according to (3-14) wherein the carbon powder is boron-solid-solubilized carbon black having a volume resistivity of at most 0.1 Ωcm according to JIS K1469.

(3-16) The metal base circuit board according to any one of (3-1) to (3-15) wherein the heat conductivity of the insulating layer is from 1 to 4 W/mK, and the withstand voltage between the conductive circuit and the metal foil is at least 1.0 kV.

(3-17) A light-emitting diode having at least one light-emitting diode electrically connected to the conductive circuit of the metal base circuit board as defined in any one of (3-1) to (3-16).

(4-1) A LED light source unit having a metal base circuit board having a conductive circuit formed on a metal foil via an insulating layer, disposed on a surface of a case via an adhesive tape and having at least one light-emitting diode (LED) mounted on the conductive circuit of the metal base circuit board, wherein the thickness of the metal foil is from 18 μm to 300 μm, the insulating layer comprises an inorganic filler and a thermosetting resin and has a thickness of from 80 μm to 200 μm, and the thickness of the conductive circuit is from 9 μm to 140 μm.

(4-2) The LED light source unit according to (4-1), wherein the heat conductivity of the insulating layer is from 1 to 4 W/mK.

(4-3) The LED light source unit according to (4-1) or (4-2) wherein the insulating layer contains a thermosetting resin in an amount of from 25 to 50 vol %, and the rest being an inorganic filler comprising spherical coarse particles having a maximum particle size of at most 75 μm and an average particle size of from 10 to 40 μm and spherical fine particles having an average particle size of from 0.4 to 1.2 μm.

(4-4) The LED light source unit according to any one of (4-1) to (4-3) wherein the glass transition temperature of the thermosetting resin in the insulating layer is from 0 to 40° C.

(4-5) The LED light source unit according to any one of (4-1) to (4-4), wherein the thermosetting resin contains a hydrogenated bisphenol F and/or A epoxy resin.

(4-6) The LED light source unit according to any one of (4-1) to (4-5), wherein the thermosetting resin contains a straight-chain epoxy resin having an epoxy equivalent of from 800 to 4,000.

(4-7) The LED light source unit according to any one of (4-1) to (4-6), wherein the thermosetting resin contains a polyoxyalkylene polyamine.

(4-8) The LED light source unit according to any one of (4-1) to (4-7), wherein the polyoxyalkylene polyamine is contained so that the active hydrogen equivalent would be from 0.8 to 1 time, to the epoxy equivalent of the epoxy resin contained in the thermosetting resin.

(4-9) The LED light source unit according to any one of (4-1) to (4-8), wherein the metal base circuit board is bent at an angle of at least 90° with a radius of curvature of from 1 to 5 mm to the conductive circuit side or to the side opposite to the conductive circuit side along at least one portion other than the LED-mounted portion, and the withstand voltage between the conductive circuit and the metal foil of the bent metal base circuit board is at least 1.5 kV.

(4-10) The LED light source unit according to any one of (4-1) to (4-9), wherein the heat conductivity of the adhesive tape is from 1 to 2 W/mK, and the thickness of the adhesive tape is from 50 μm to 150 μm.

(4-11) The LED light source unit according to any one of (4-1) to (4-10), wherein the adhesive tape contains a polymer containing acrylic acid and/or methacrylic acid.

(4-12) The LED light source unit according to any one of (4-1) to (4-11), wherein the adhesive tape contains a heat conductive electrical insulating agent in an amount of from 40 to 80 vol %.

(4-13) The LED light source unit according to any one of (4-1) to (4-12), wherein the heat conductive electrical insulating agent is an acrylic rubber.

(4-14) The LED light source unit according to any one of (4-1) to (4-13), wherein the polymer is an acrylic polymer obtained by polymerizing a monomer containing a (meth) acrylate monomer.

(4-15) The LED light source unit according to any one of (4-1) to (4-14), wherein the (meth)acrylate monomer contains 2-ethylhexyl acrylate.

(4-16) The LED light source unit according to any one of (4-1) to (4-15), wherein the heat conductive electrical insulating agent has a maximum particle size of at most 45 μm and an average particle size of from 0.5 to 30 μm.

(4-17) The LED light source unit according to any one of (4-1) to (4-16), wherein the heat conductive electrical insulating agent is at least one member selected from the group consisting of alumina, crystalline silica and aluminum hydroxide.

Now, the present invention will be described in detail with reference to preferred embodiments.

The following construction of a metal base circuit board and the main constituting materials such as a metal foil, an inorganic filler, a thermosetting resin and a conductive circuit, are optionally applicable to a hybrid integrated circuit, a LED module or a LED light source unit.

Metal Base Circuit Board

The construction of the metal base circuit board as the base of the present invention, the properties of constituting materials, etc. will be described. The circuit board of the present invention is a metal base circuit board having an insulating layer and a conductive circuit or metal foil alternately laminated, wherein the thickness of the conductive circuit or metal foil is from 5 μm to 450 μm, the insulating layer is made of a cured product of a resin composition comprising an inorganic filler and a thermosetting resin, and the thickness of the insulating layer is from 9 μm to 300 μm.

Namely, if the thickness of the conductive circuit or metal foil is less than 5 μm, such can not be produced in view of a problem of e.g. handling, and if it is more than 450 μm, the bendability tends to deteriorate, and the circuit board becomes entirely thick.

In the present invention, the metal base circuit board can be used as being bent at room temperature, and further is useful even when it is bent repeatedly. Thus, it has high processability and can be re-used.

Metal Foil

As the material for the metal foil, aluminum or an aluminum alloy, copper or a copper alloy, iron or stainless steel, may, for example, be used. Further, depending upon the material for the metal foil, it is preferred to apply surface treatment such as electrolytic treatment, etching treatment, plasma treatment, primer treatment or coupling treatment on the insulating layer side of the metal foil in order to improve the adhesion.

Insulating Layer

In the present invention, the heat conductivity of the insulating layer is preferably from 1 to 4 W/mK, further preferably from 2 to 3 W/mK. If the heat conductivity is less than 1 W/mK, the heat transfer resistance of the circuit board tends to be high, whereby the desired heat dissipation performance may not be obtained. On the other hand, in order to obtain a heat conductivity higher than 4 W/mK, it will be necessary to increase the amount of the inorganic filler, whereby the flexibility will be lost, and good bending performance tends to be hardly obtainable.

Further, the glass transition temperature of the insulating layer is preferably from 0 to 40° C., more preferably from 10 to 30° C. If the glass transition temperature is lower than 0° C., the rigidity and the electrical insulating performance tend to be low, and if it exceeds 40° C., the bendability tends to be low. When the glass transition temperature is from 0 to 40° C., as is different from an insulating layer employed in a conventional metal base board which is hard at room temperature, even when it is subjected to bending or drawing at room temperature, deterioration of the withstand voltage due to delamination from the metal foil or cracking of the insulating layer tends to hardly take place.

The thickness of the insulating layer is preferably from 9 µm to 300 µm.

In the present invention, the insulating layer is a cured product of a resin composition comprising from 25 to 60 vol % of a thermosetting resin and the rest being an inorganic filler comprising spherical coarse particles having a maximum particle size of at most 75 µm and an average particle size of 5 to 40 µm, and spherical fine particles having an average particle size of from 0.3 to 3.0 µm. If the thermosetting resin is contained more than the above vol %, the heat dissipation performance tends to be low, whereby the above-mentioned heat conductivity will be hardly obtainable.

As the thermosetting resin constituting the insulating layer, to a resin composed mainly of a straight-chain polymer epoxy resin having an epoxy equivalent of from 800 to 4,000, or a hydrogenated bisphenol F and/or a epoxy resin, a phenol resin, a polyimide resin, a phenoxy resin, an acryl rubber or an acrylonitrile/butadiene rubber may, for example, be further incorporated. However, the amount of their incorporation is preferably at most 30 mass %, based on the total amount with the epoxy resin, taking into consideration the bendability at room temperature, the electrical insulating performance and the heat resistance.

As the thermosetting resin constituting the insulating layer, an epoxy resin, a phenol resin, a silicone resin or an acrylic resin may, for example, be used. Among them, one comprising an epoxy resin and a polyaddition type epoxy curing agent as the main components, is preferred which is excellent in the bond strength to the metal foil 1 and the conductive circuit in its cured state even when containing an inorganic filler and which is excellent in bendability at room temperature.

As such a polyaddition type epoxy curing agent, a polyoxyalkylene polyamine is preferred which is effective to improve the bendability of the thermosetting resin after the thermosetting, and it is preferred to add it so that the active hydrogen equivalent will be from 0.8 to 1 time to the epoxy equivalent of the epoxy resin contained in the thermosetting resin, in order to secure the rigidity, bending processability, insulating performance, etc. of the insulating layer.

Further, as the thermosetting resin constituting the insulating layer, it is preferred to employ a hydrogenated bisphenol F and/or A epoxy resin, and when the epoxy equivalent is from 180 to 240, it is liquid at room temperature and can be used within a range of from 60 to 100 mass % in the thermosetting resin. As compared with common bisphenol F or A, this hydrogenated bisphenol F and/or A epoxy resin is not of a stiff structure and thus is excellent in bendability when formed into a curable resin composition. Further, since the viscosity of the resin is low, it is possible to add a straight-chain polymer epoxy resin having an epoxy equivalent of from 800 to 4,000 in an amount of from 0 to 40 mass % in the thermosetting resin and an inorganic filler in an amount of from 50 to 75 vol % in the insulating layer.

If the epoxy equivalent of the hydrogenated bisphenol F and/or A epoxy resin is less than 180, low molecular weight impurities having epoxy groups remaining in the purification process of the epoxy resin tend to be large in amount, whereby the bond strength or the insulating property tends to be low, such being undesirable. On the other hand, if the epoxy equivalent exceeds 240, the resin viscosity tends to be high and by the addition of the straight-chain polymer epoxy resin having an epoxy equivalent of from 800 to 4,000, the resin viscosity will further be increased, and it will be difficult to add the high molecular epoxy resin in an amount of from 0 to 40 mass % in the thermosetting resin or the inorganic filler in an amount of from 50 to 75 vol % in the insulating layer.

When a straight-chain polymer epoxy resin having an epoxy equivalent of from 800 to 4,000 is incorporated in the insulating layer, the bonding property will be improved as compared with a case where a straight-chain epoxy resin having an epoxy equivalent of less than 800 is used alone as the thermosetting resin. Further, it is more preferred that the straight-chain polymer epoxy resin having an epoxy equivalent of from 800 to 4,000 is a hydrogenated bisphenol F and/or A epoxy resin, whereby in addition to the bonding property, bendability at room temperature will be improved.

If a straight-chain epoxy resin having an epoxy equivalent exceeding 4,000 is incorporated in the thermosetting resin, incorporation of the inorganic filler tends to be difficult, and compatibility with other epoxy resins tends to be difficult, whereby an insulating layer will be formed in such a state that the epoxy resin, the epoxy curing agent, the inorganic filler and other incorporated components are in a non-uniform state, and the heat dissipation performance and the electrical insulating performance tend to deteriorate. It is preferred that the straight-chain epoxy resin having an epoxy equivalent of from 800 to 4,000 is added in an amount of at most 40 mass % in the curable resin. If it exceeds 40 mass %, the amount of the epoxy curing agent tends to be small, and there may be a case where the glass transition temperature (Tg) of the thermosetting resin rises, and the bendability deteriorates.

The chloride ion concentration in the thermosetting resin constituting the insulating layer is preferably at most 500 ppm, more preferably at most 250 ppm. In the case of a conventional metal base circuit board, the chloride ion concentration in the curable resin composition may be at most 1,000 ppm to obtain electrical insulating performance even at a high temperature at a DC voltage. However, the curable resin composition constituting the insulating layer to be used for the metal base circuit board of the present invention, has a flexible structure which is bendable even at room temperature, and accordingly, if the chloride ion concentration in the curable resin composition exceeds 500 ppm, transfer of ionic impurities may take place at a high temperature under a DC voltage, and the electrical insulating performance may tend to deteriorate.

The inorganic filler to be contained in the insulating layer is preferably one having an electrical insulating property and good heat conductivity, and, for example, silicon dioxide, aluminum oxide, aluminum nitride, silicon nitride or boron nitride may be employed. The inorganic filler preferably comprises spherical coarse particles having a maximum particle size of at most 75 µm and an average particle size of from 5 to 40 µm and spherical fine particles having an average particle size of from 0.3 to 3.0 µm. Within such a range, more preferred is one comprising spherical coarse particles having an average particle size of from 10 to 40 µm and spherical fine particles having an average particle size of from 0.4 to 1.2 µm.

When spherical coarse particles and spherical fine particles are mixed, high packing will be possible, and bendability at room temperature will be improved over a case where pulverized particles or spherical particles are used alone.

The content of the inorganic filler in the insulating layer is preferably from 50 to 75 vol %, more preferably from 55 to 65 vol %.

The sodium ion concentration in the inorganic filler is preferably at most 500 ppm, more preferably at most 100 ppm. If the sodium ion concentration in the inorganic filler exceeds 500 ppm, transfer of ionic impurities is likely to take place at a high temperature under a DC voltage, whereby the electrical insulating performance may tend to deteriorate.

In the present invention, further, at least one through-hole to be used for electrically connecting conductive circuits or metal foils is preferably at least 0.0078 $mm^2$. For such a through-hole, the conductive circuits or metal foils and an insulating layer are chemically, physically or mechanically removed to form a perforation for the through-hole, and in its void space, a conductive material or the like is filled by plating, printing or the like, or wire bonding from the upper layer conductive circuit is applied to establish the electrical connection. Such through-holes may be formed or may not be formed.

Conductive Circuit

In the present invention, the circuit board is bendable at an optional portion at an angle of at least 90° with a radius of curvature of from 1 to 5 mm, and the withstand voltage between conductive circuits or metal foils is preferably at least 1.0 kV. When the board is bent at an angle of at least 90° with a radius of curvature of less than 1 mm, the withstand voltage between conductive circuits or metal foils may sometimes become to be at most 1.0 kV due to e.g. cracking in the insulating layer. If the radius of curvature exceeds 5 mm or if the bending angle is less than 90°, the desired small-sizing of the module may not be accomplished sometimes.

The thickness of the conductive circuit is preferably from 9 μm to 140 μm. If it is less than 9 μm, the function as the conductive circuit tends to be inadequate, and if it exceeds 140 μm, not only the bendability tends to deteriorate, but also the thickness increases, whereby small-sizing or thickness reduction is tends to be difficult.

Hybrid Integrated Circuit

Now, a preferred embodiment of a hybrid integrated circuit employing the metal base circuit board of the present invention will be described. In the hybrid integrated circuit employing the metal base circuit board of the present invention, the above-described metal foil, inorganic filler, thermosetting resin, conductive circuit, etc. as the main constituting materials in the metal base circuit board can optionally be used.

FIG. 1-1 is an example of a hybrid integrated circuit employing the metal base circuit board of the present invention.

In the hybrid integrated circuit of the present invention, on a conductive circuit 3 of the metal base circuit board comprising a metal foil 1, an insulating layer 2 and the conductive circuit 3, a plurality of semiconductors, i.e. a power semiconductor 5, a control semiconductor 6 and a chip component 8 are mounted as bonded by e.g. a solder joint portion 9, and the metal base circuit board is closely bonded to a case 11 having a heat dissipation performance via a heat conductive adhesive 10. In many cases, the power semiconductor 5 is connected to the conductive circuit 3 via a heat spreader 4 for the purpose of facilitating heat dissipation, but such a heat spreader may not be used in some cases.

Further, the control semiconductor 6 usually accompanies no substantial heat generation and thus is connected to the conductive circuit 3 without interposition of a heat spreader, but a heat spreader may be interposed as the case requires.

As the above heat conductive adhesive, an adhesive having a highly heat conductive filler such as gold, silver, nickel, aluminum nitride, aluminum or alumina incorporated to an epoxy resin, a urethane resin, a silicone resin or the like, is employed. Instead of the heat conductive adhesive, a heat conductive adhesive sheet preliminarily formed into a sheet, may be used.

Further, any fixing method such as bonding by means of a silicone grease or fixing by means of a screw, may be employed so long as it is a fixing method whereby the metal base circuit board is closely bonded with the case 11 having heat dissipation performance so that the heat conduction is excellent between the metal base circuit board and the case 11 having heat dissipation performance. Further, the heat conductive adhesive may be used for the purpose of facilitating heat dissipation of the power semiconductor 5 or for the purpose of protecting or fixing the hybrid integrated circuit, but this may not be used in some cases.

The signal from the control semiconductor 6 is electrically connected to the power semiconductor 5 via the conductive circuit 3 and the bonding wire 7. Other than the portions on which the power semiconductor 5, the control semiconductor 6 and the chip component 8 are mounted, the metal foil 1, the insulating layer 2 and the conductive circuit 3 constituting the metal base circuit board may be subjected to bending or drawing processing at room temperature to meet the shape of a heat dissipation plate or the case 11 having heat dissipation performance. Yet, the metal base circuit board can be not only installed on a flat portion but also closely bonded to a side or bottom surface or to a stepped or curved surface depending upon the shape of the heat dissipation plate or the case having heat dissipation performance. Therefore, small-sizing or reduction of the thickness of a highly heat generating hybrid integrated circuit is made possible which can not be accomplished with the conventional metal base circuit board or flexible circuit board.

The hybrid integrated circuit using the metal base circuit board of the present invention has the above-described construction, and yet has properties equal to the conventional metal base circuit board having a flat metal plate, such that the heat conductivity of the insulating layer is from 1 to 4 W/mK and the withstand voltage between the conductive circuit and the metal foil is at least 1.5 kV. Besides, it can be not only installed at a flat portion but also closely bonded to a side or bottom surface or to a stepped or curved surface of a case. Further, even in a state where an electrical component such as a semiconductor element or resistant chip which requires heat dissipation, is mounted, it can easily be bent at room temperature, whereby a conventional limitation such that a metal base circuit board can be applied only to a flat portion, can be eliminated.

The thickness of the metal foil 1 is usually from 5 μm to 450 μm, but it is more preferably from 35 μm to 70 μm, whereby the rigidity, bending processability, drawing processability, etc. of the metal base circuit board can be secured.

The thickness of the insulating layer 2 is preferably from 80 μm to 200 μm. If it is less than 80 μm, the insulating performance tends to be low, and if it exceeds 200 μm, not only the heat dissipation performance tends to deteriorate, but also the thickness increases, whereby small-sizing or reduction of the thickness tends to be difficult.

LED Module

Now, a preferred embodiment of a LED module (hereinafter referred to simply as LED array) having a cover array on the surface of the metal base circuit board will be described. In the LED array using the metal base circuit board of the present invention, the above-described metal foil, inorganic filler, thermosetting resin, conductive circuit, etc. as the main constituting materials in the metal base circuit board can be optionally used.

FIGS. 2-1 to 2-7 are plan views illustrating the schematic constructions with respect to an example of a LED module using the metal base circuit board of the present invention.

In the LED module using the metal base circuit board of the present invention, of the metal base circuit board comprising a metal foil 21, an insulating layer 22, a conductive circuit 23 and electrodes 24, the metal foil 21 and the insulating layer 22 are partially removed to form a slit portion 25 at a portion where no conductive circuit 23 or no electrodes 24 are formed.

Figures 1, 2:
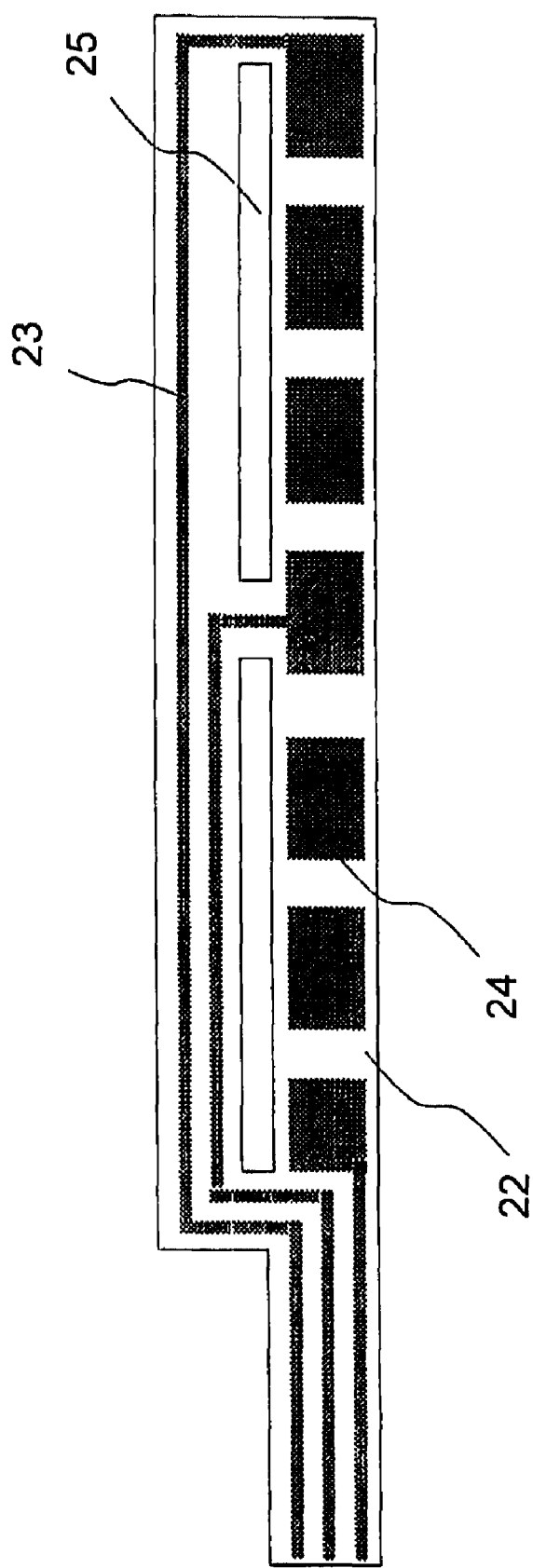
Figure 2:
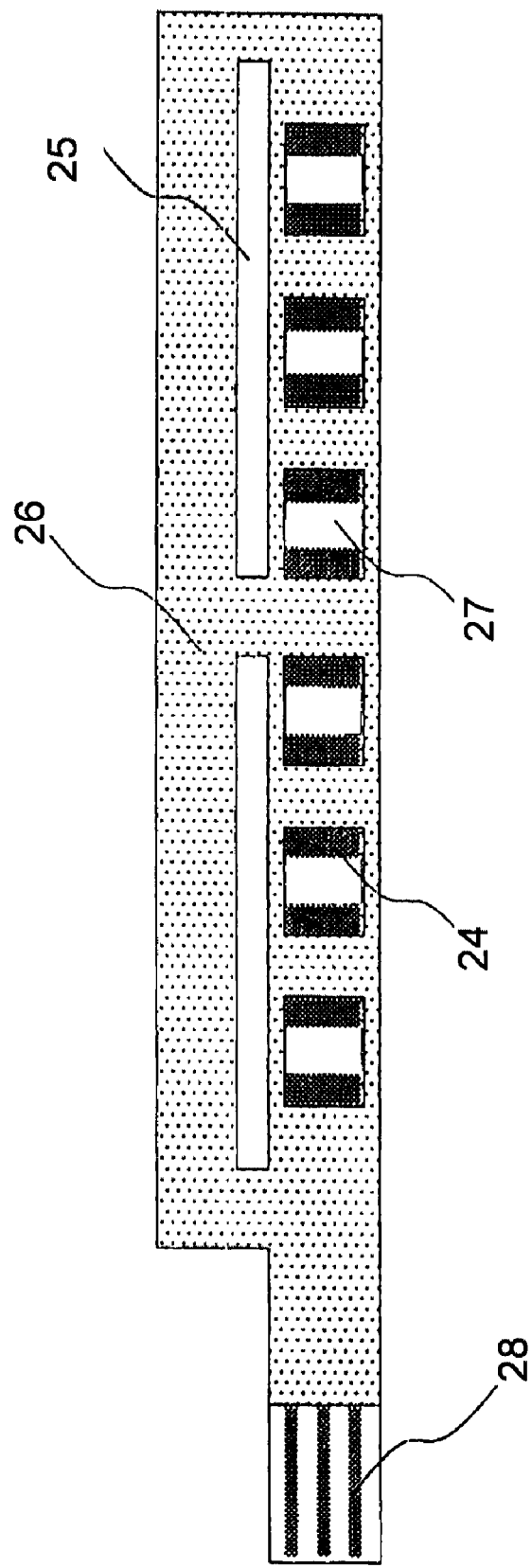

In FIGS. 2-2, the metal base circuit board of FIGS. 2-1 is reinforced by bonding a coverlay 26 on the side where the conductive circuit 23 and electrodes 24 are formed, other than areas for component-mounted portions 27 and an input terminal 28. Here, the coverlay 26 at a portion where no conductive circuit 23 or electrodes 24 are formed, is also removed in the same manner as the metal foil 21 and the insulating layer 22, to form a slit portion 25. The slit portion 25 of the coverlay 26 is preferably processed from 50% to 95% relative to the length of the portion to be bent. When the slit portion is processed at least 50% relative to the length of the portion to be bent, bending can be done at an angle of 90° with a radius of curvature of at most 0.5 mm, and when it is processed at most 95%, there will be no reinforcing effect of the coverlay at the bending portion, and there will be no possibility of a failure such as cracking in the insulating layer or breaking of the conductive circuit at the bending portion. The thickness of such a coverlay is preferably from 5 μm to 25 μm.

Figures 2, 3:
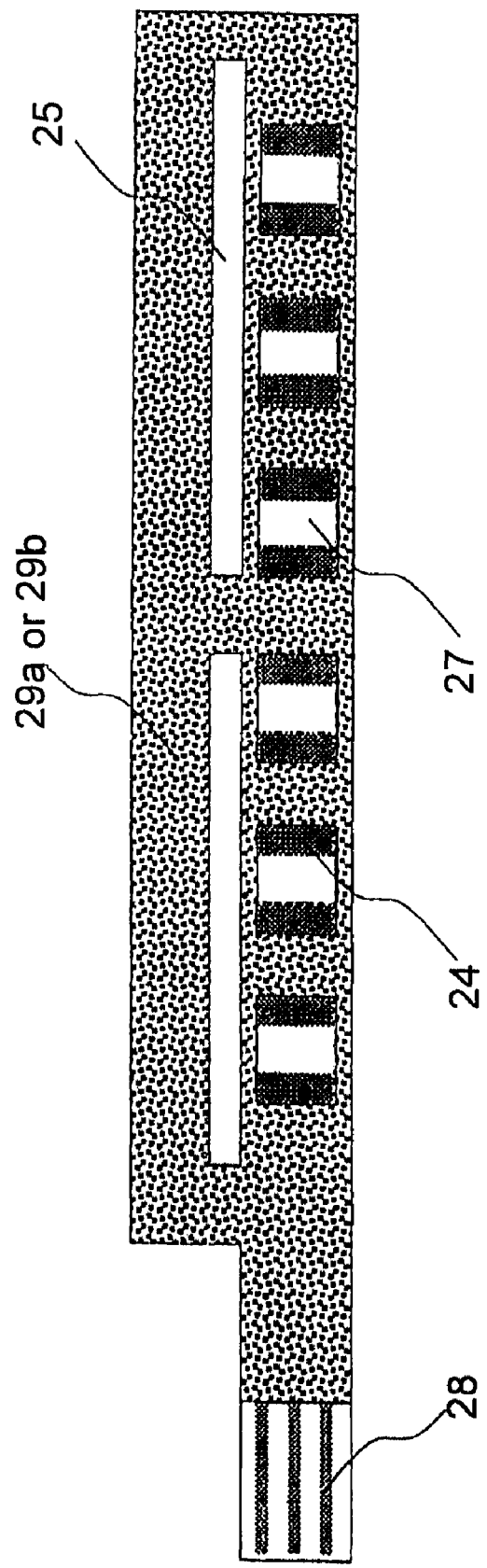

In FIG. 2-3, a layer 29a having a magnetic loss or a layer 29b having a dielectric loss is formed on the top having the coverlay 26 bonded to the metal base circuit board of FIG. 2-2.

The layer 29a having a magnetic loss is made of a magnetic material having an aspect ratio of at least 2 and an organic binder material, and when the content of the magnetic material is from 30 to 70 vol %, and the thickness of the layer is from 3 μm to 50 μm, it exhibits an excellent magnetic loss characteristic.

Further, in the metal base circuit board of FIG. 2-3, when the layer 29b having a dielectric loss is formed, the layer having the dielectric loss is made of a carbon powder having a specific surface area of from 20 to 110 m$^2$/g and an organic binder material, and when the content of the carbon powder is from 5 to 60 vol %, and the thickness is from 3 μm to 50 μm, it exhibits an excellent dielectric loss characteristic.

The carbon powder for the layer having a dielectric loss is preferably a boron-solid-solubilized carbon black having a volume resistivity of at most 0.1 Ωcm according to JIS K1469, whereby an excellent dielectric loss characteristic will be obtained.

Figures 2, 3, 4:
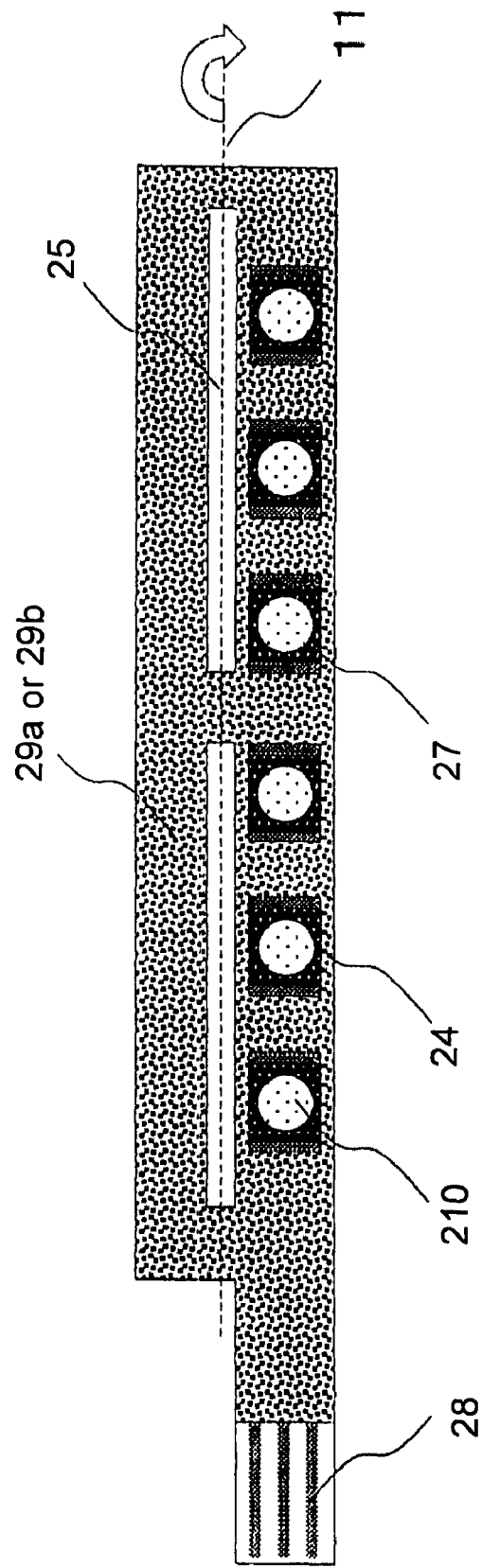
Figures 2, 3, 4, 5:
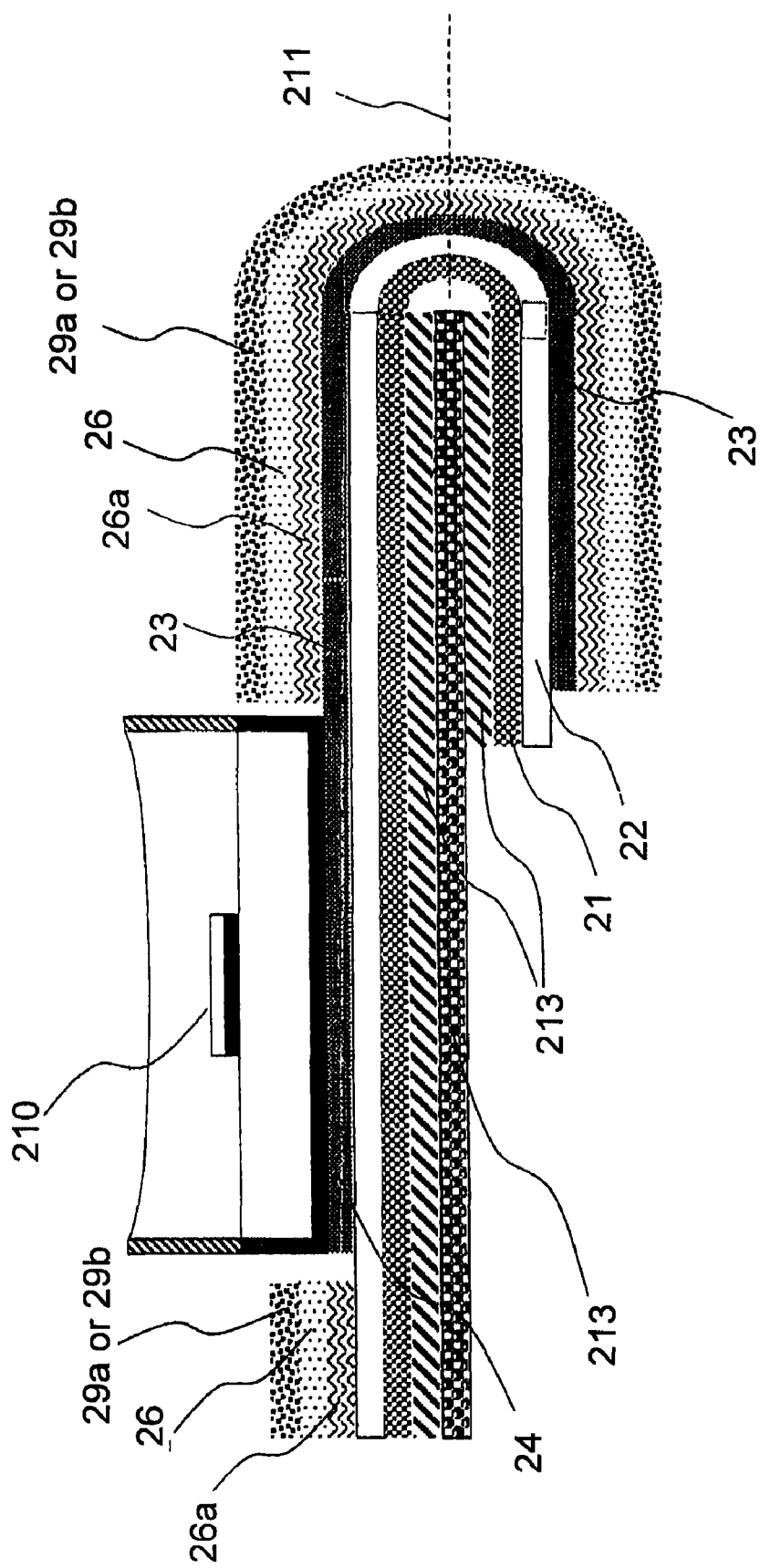
Figures 2, 3, 4, 5, 6:
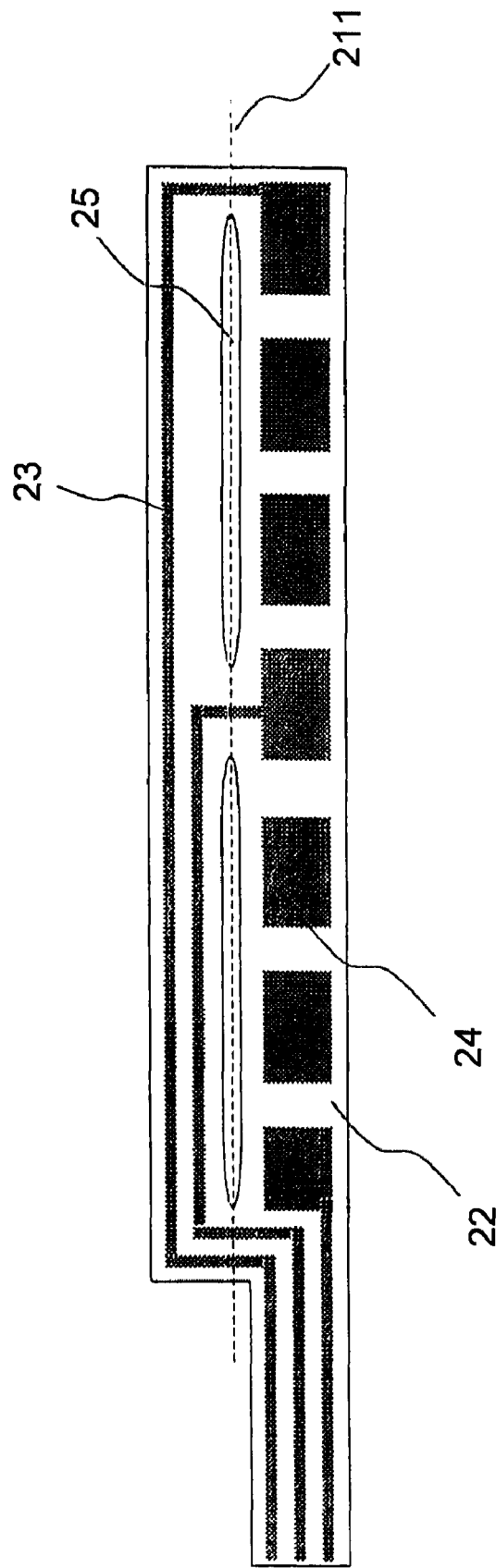
Figures 2, 3, 4, 5, 6, 7:
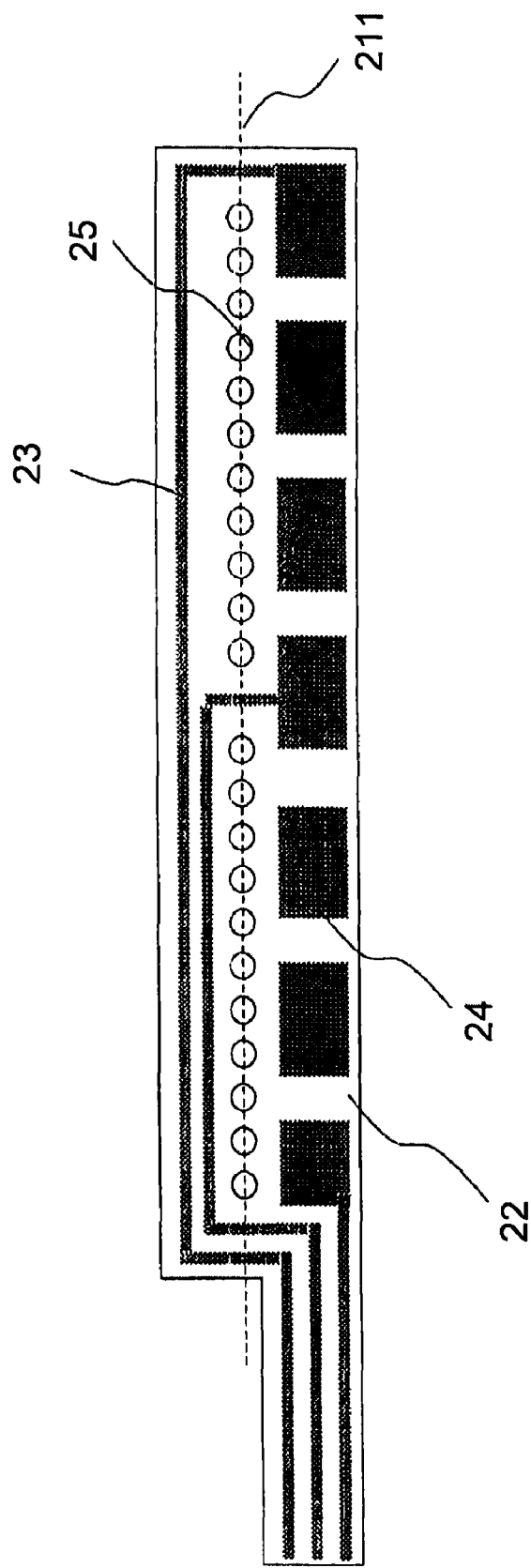
Figures 1, 3:
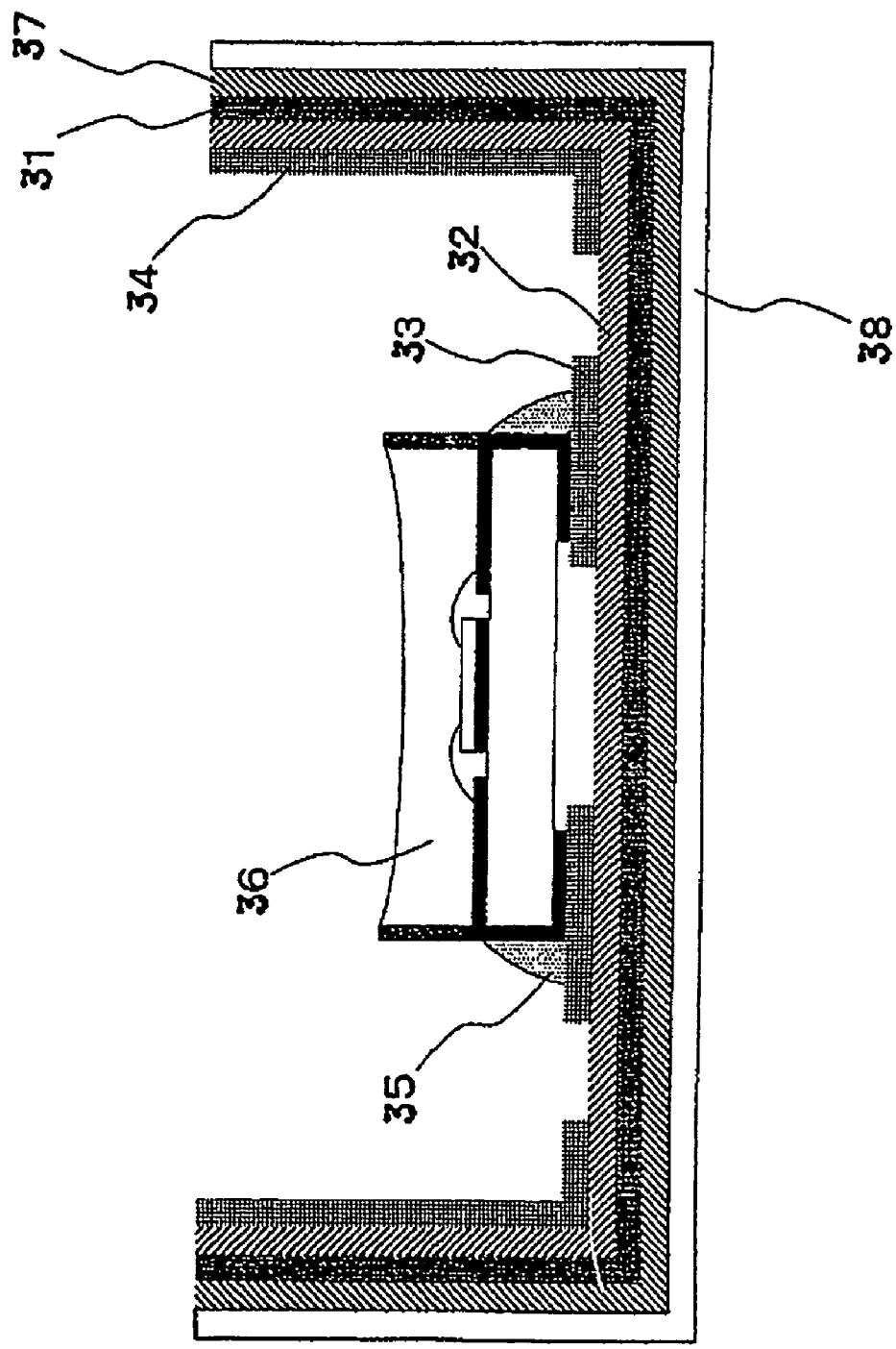

In FIG. 2-4, in the metal base circuit board of the present invention, heat generating components 210 are mounted on the component-mounted portions. Here, the dotted line in FIG. 2-4 shows a bending portion 211 of the metal base circuit board of the present invention. At the bending portion 211, a slit portion 25 is formed, whereby the board can easily be bent, and even when bent, the conductive circuit at the bending portion is reinforced by the coverlay 26, whereby there will be no breaking or no cracking in the insulating layer.

Thus, in the metal base circuit board of the present invention, the board is reinforced by the coverlay, and even if it is bent, a failure such as breaking of the conductive circuit or cracking of the insulating layer will be prevented, and by the slit processing, it has a substantial merit such that the bending property is good. Further, by the formation of the layer having a magnetic loss or the layer having a dielectric loss, the metal base circuit board has good electromagnetic wave absorbing properties.

Heretofore, a metal base circuit board having a thickness of about 150 μm has had a problem that if it is bent at an angle of at least 90° with a radius of curvature of at most 0.5 mm, a failure such as breaking of the conductive circuit or cracking of the insulating layer occurs, and it has been necessary to reinforce it with a coverlay. However, if it is reinforced by a coverlay, the metal base circuit board becomes stiff, and it becomes difficult to bend it at a desired portion.

Whereas, the present invention provides an epoch making metal base circuit board which satisfies both the bendability and reinforcement of the board against bending and which is additionally provided with electromagnetic absorbing properties.

FIG. 2-5 shows a schematic construction with respect to an example of a LED module using the metal base circuit board of the present invention. It is a cross-sectional view in a case where with respect to the metal base circuit board of FIG. 2-4, an input circuit is bent at an angle of 180° along the slit portion. In the metal base circuit board of the present invention, the coverlay 26 and further the layer 29a having a magnetic loss or the layer 29b having a dielectric loss are formed via an epoxy adhesive layer 25a to the metal base circuit board comprising the metal foil 21, the insulating layer 22, the conductive circuit 23 and the electrodes 24.

In the metal base circuit board of FIGS. 2-5, the conductive circuit 23 and the electrode 24 are electrically connected, and on the electrode 24, a heat generating component 210 is mounted as electrically connected by e.g. a solder. Further, the rear side of the metal base circuit board is closely bonded to the case 212 having heat dissipation performance, via a heat conductive adhesive tape 213. The conductive circuit 23 and a lead wiring (input circuit) are electrically connected, so that the electric power can be input from the exterior to the heat generating component such as LED.

In FIG. 2-5, the board is bent to the metal foil 21 side, but in the present invention, it is possible to bend it to the side of the layer 29a having a magnetic loss or the layer 29b having a dielectric loss. So long as, with respect to at least the coverlay at the portion to be bent, slit processing is done from 50% to 95% relative to the length of the portion to be bent, bending can be done in various shapes depending upon the shape of the case 212 having heat dissipation performance.

The above-described slit processing is not limited to the rectangular processing shown in the metal base circuit board in FIGS. 2-1 to 2-4, and it may be one wherein the corners are acute-angled or wedge-shaped as shown in FIG. 2-6, or one wherein many circular holes are formed as shown in FIG. 2-7. Circular holes may rather be preferred, since the bending portion can thereby be easily determined.

The LED array using the metal base circuit board of the present invention has the above-described construction, and it is preferred that the thickness of the metal foil 21 is from 5 μm to 40 μm, the insulating layer 22 comprises the inorganic filler and the thermosetting resin and has a thickness of from 30 μm to 80 μm, and the thickness of the conductive circuit is from 9 µm to 40 µm. When such various conditions are satisfied, the purpose of the present invention can more certainly be accomplished.

When the thickness of the metal foil 21 is at least 5 µm, there is no such a possibility that the rigidity of the metal base circuit board deteriorates and the application is limited. When the thickness of the metal foil 21 is at most 40 µm, there will be no possibility that a die for bending or a die for drawing the metal base circuit board, or a processing equipment such as a pressing machine, is required, or there will be no possibility such that it becomes difficult to closely bond the metal base circuit board to e.g. a curved surface of a case. Further, there will be no difficulty in bending at room temperature in such a state that an electrical component such as a semiconductor element or resistant chip which requires heat dissipation, is mounted on the metal base circuit board. The thickness of the metal foil 21 is more preferably from 12 µm to 35 µm, since the rigidity, bending processability, drawing processability, etc., particularly the bending processability at an angle of at least 90° with a radius of curvature of from 0.1 to 0.5 mm, of the metal base circuit board, will be thereby excellent.

In the LED array using the metal base circuit board of the present invention, it is preferred that the insulating layer 22 comprises the inorganic filler and the thermosetting resin and has a thickness of from 30 µm to 80 µm. With respect to the thickness of the insulating layer 22, when it is at least 30 µm, the insulating performance can be secured, and when it is at most 80 µm, such is preferred since bending processability at an angle of at least 90° with a radius of curvature of from 0.1 to 0.5 mm will not be low.

In the LED array using the metal base circuit board of the present invention, the thickness of the conductive circuit is preferably from 9 µm to 40 µm. When it is at least 9 µm, the function as a conductive circuit can sufficiently be secured, and when it is at most 40 µm, sufficient bendability can be secured, and a sufficient thickness for small-sizing or reduction of the thickness can be secured.

Further, the heat conductive adhesive tape 213 to be used in the present invention may be one having incorporated in a polymer resin material a heat conductive electrical insulating agent made of a metal oxide such as aluminum oxide or titanium dioxide, a nitride such as aluminum nitride, boron nitride or silicon nitride, an inorganic substance such as silicon carbide or aluminum hydroxide, or an organic substance such as acrylic rubber. Further, a heat conductive adhesive tape having one surface-treated by e.g. a silane coupling agent incorporated in a polymer resin material, may also be used.

The heat conductive adhesive tape 213 is preferably one having the heat conductivity improved over the conventional adhesive tape, in order to efficiently dissipate the heat generated from the heat generating component from the rear side of the metal base board to the case via the metal base circuit board.

For the heat conductive adhesive tape 213, an adhesive tape having characteristics and the base material used in the following "LED light source unit" may suitably be used.

LED Light Source Unit

A preferred embodiment of a LED light source unit using the metal base circuit board of the present invention will be described.

For the LED light source unit using the metal base circuit board of the present invention, the above-described metal foil, inorganic filler, thermosetting resin, conductive circuit, etc., as the main constituting materials in the metal base circuit board can be optionally used.

FIG. 3-1 is a cross-sectional view showing a schematic construction with respect to an example of the LED light source unit of the present invention.

In the LED light source unit of the present invention, at least one LED 36 is mounted as bonded by e.g. a solder joint portion 35 on a conductive circuit 33 is of the metal base circuit board comprising a metal foil 31, an insulating layer 32 and the conductive circuit 33, and the board is closely bonded to a case 38 having a heat dissipation performance, via a heat conductive adhesive tape 37. The conductive circuit 33 and a lead wiring (input circuit) 34 are electrically connected, so that the power can be input from the exterior to LED.

In FIGS. 3-1, the overall shape is a box shape. However, in the present invention, so long as the metal foil 31, the insulating layer 32 and the conductive circuit 33 constituting the metal base circuit board other than the portion on which LED 36 is mounted, are closely bonded to the case 38 having heat dissipation performance, various shapes may be adopted to meet the surface shape of the case 38 having the heat dissipation performance.

The LED light source unit of the present invention has the above-described construction, and it is preferred that the thickness of the metal foil 31 is from 18 µm to 300 µm, and the insulating layer 32 comprises the inorganic filler and the thermosetting resin and has a thickness of from 80 µm to 200 µm, and the thickness of the conductive circuit 33 is from 9 µm to 140 µm.

The thickness of the metal foil 31 is preferably from 18 µm to 300 µm. If the thickness of the metal foil 31 is less than 18 µm, the rigidity of the metal base circuit board tends to deteriorate, and the application will be limited. If the thickness exceeds 300 µm, not only a bending die or a drawing die, or a processing equipment such as a press machine for the metal base circuit board will be required, but also it tends to be difficult to bond the metal base circuit board to e.g. a curved surface of a case. Further, it tends to be difficult to carry out bending at room temperature in such a state that an electrical component such as a semiconductor element or resistance chip which requires heat dissipation is mounted on the metal base circuit board. The thickness is more preferably from 35 µm to 70 µm, whereby the metal base circuit board will be excellent in the rigidity, bending processability, drawing processability, etc., particularly in the bending processability at an angle of at least 90° with a radius of curvature of from 1 to 5 mm.

The insulating layer 32 comprises the inorganic filler and the thermosetting resin, and preferably has a thickness of from 80 µm to 200 µm. With respect to the thickness of the insulating layer 32, if it is less than 80 µm, the insulating performance tends to be low, and if it exceeds 200 µm, not only the heat dissipation performance tends to deteriorate but also the thickness increases, whereby small-sizing or reduction of the thickness tends to be difficult.

In the LED light source unit of the present invention, the thickness of the conductive circuit is from 9 µm to 140 µm. If it is less than 9 µm, the function as a conductive circuit tends to be inadequate, and if it exceeds 140 µm, not only the bendability tends to deteriorate, but also the thickness increases, whereby small-sizing or reduction of the thickness tends to be difficult.

The LED light source unit of the present invention is useful even when it is repeatedly bent. Thus, its processability is high, and it can be reused. Further, it is possible to easily produce a LED light source unit having a case having a curved surface by mounting LED on the metal base circuit board, followed by bonding to a case having a flat portion, and then processing for deformation together with the case, and thus it will be possible to provide a large amount of LED light source units at low costs.

As the heat conductive adhesive tape 37 to be used in the present invention, as described hereinafter, one having incorporated in a polymer resin material a heat conductive electrical insulating agent made of a metal oxide such as aluminum oxide or titanium dioxide, a nitride such as aluminum nitride, boron nitride or silicon nitride, an inorganic substance such as silicon carbide or aluminum hydroxide, or an organic substance such as acrylic rubber, may be used. Further, a heat conductive adhesive tape having one surface-treated by e.g. a silane coupling agent incorporated in a polymer resin material, may also be used.

With an adhesive tape having no heat conductivity, conduction of the heat accompanied by luminance of LED to the case tends to be inadequate, whereby the temperature rise of LED will be brought about. Thus, such an adhesive tape can not be used. According to the results of the study by the present inventors, it is preferred to use a heat conductive adhesive tape having a heat conductivity of from 1 to 2 W/mK and having a thickness of from 50 to 150 μm.

The heat conductive adhesive tape 37 is characterized in that the heat conductivity is improved over the conventional adhesive tape, so that the heat generated at the time of the light emission of LED is effectively dissipated from the rear side of the metal base board to the case via the metal base circuit board.

The polymer material to be used for the heat conductive adhesive tape 37 is not particularly limited. However, in order to improve the adhesion to a metal, a polymer containing acrylic acid and/or methacrylic acid is preferably selected. Namely, an acrylate or methacrylate having a $C_{2-12}$ alkyl group or a $C_{2-12}$ alkylester of acrylic acid or methacrylic acid, is preferred.

From the viewpoint of the flexibility and processability, as the monomer, it is preferred to use one or more members selected from ethyl acrylate, propyl acrylate, butyl acrylate, 2-ethylhexyl acrylate, octyl acrylate, isooctyl acrylate, decyl acrylate, decyl (meth)acrylate and dodecyl (meth)acrylate. Among them, 2-ethylhexyl acrylate is more preferred as the monomer.

The heat conductive adhesive tape 37 preferably contains a heat conductive electrical insulating agent. The heat conductive electrical insulating agent may be any material so long as it is an inorganic or organic substance having good heat conductivity and electrical insulting properties. As an organic substance, natural rubber, or a rubber such as NBR or EPDM is preferred, and particularly preferred is one containing acrylic rubber. Such a heat conductive electrical insulating agent is preferably contained in an amount of from 40 to 80 vol % in the adhesive tape 37, whereby good heat dissipation performance can be secured. From 50 to 70 vol % is a more preferred range.

The monomer for such acrylic rubber may, for example, be ethyl acrylate, n-propyl acrylate, n-butyl acrylate, isobutyl acrylate, n-pentyl acrylate, isoamyl acrylate, n-hexyl acrylate, 2-methylpentyl acrylate, n-octyl acrylate, 2-ethylhexyl acrylate, n-decyl acrylate, n-dodecyl acrylate, n-octadecyl acrylate, cyanomethyl acrylate, 1-cyanoethyl acrylate, 2-cyanoethyl acrylate, 1-cyanopropyl acrylate or 2-cyanopropyl acrylate. A combination of more than one selected among these, or acrylic rubber having a few % of a crosslinkable monomer copolymerized, is preferred. The rubber content is preferably from 0.1 to 30 parts by mass in the heat conductive adhesive tape 37. If it is less than 0.1 part by mass, when a highly heat conductive filler is incorporated in the polymer resin material, the filler will be precipitated, and if it exceeds 30 parts by mass, the viscosity tends to rise, thus leading to a problem during the processing. When the rubber content is from 0.1 to 30 parts by mass, the processability is good, while precipitation of the filler is prevented.

As such a monomer, from the viewpoint of the flexibility and adhesive property, an acrylate or methacrylate having a $C_{2-12}$ alkyl group, or a $C_{2-12}$ acryl ester of acrylic acid is preferred. From the viewpoint of the flexibility and processability, a preferred monomer is one or a blend of two or more selected from ethyl acrylate, propyl acrylate, butyl acrylate, 2-ethylhexyl acrylate, octyl acrylate, isooctyl acrylate, decyl acrylate, decyl methacrylate and dodecyl methacrylate. A more preferred monomer is 2-ethylhexyl acrylate.

The inorganic substance to be used as the heat conductive electrical insulating agent may, for example, be a metal oxide such as aluminum oxide or titanium dioxide, a nitride such as aluminum nitride, boron nitride or silicon nitride, silicon carbide or aluminum hydroxide. Among them, it is preferably at least one member selected from the group consisting of alumina, crystalline silica and aluminum hydroxide. Further, it is also possible to select one having the surface treated by e.g. a silane coupling agent.

Further, with respect to the size of the heat conductive electrical insulating agent, it is preferred that the maximum particle size is at most 45 μm, and the average particle size is from 0.5 to 30 μm, from the viewpoint of the incorporation and the thickness of the adhesive tape.

The heat conductive adhesive tape 37 may contain known polymer compounds within a range not to impair the properties desired by the present invention. Further, at the time of curing the heat conductive adhesive tape 37, known additives may be incorporated as the case requires, within a non-influential range. As such additives, for example, various additives to control the viscosity or adhesiveness, and others such as a modifier, and an aging preventive agent, a heat stabilizer and a coloring agent, may, for example, be mentioned.

The heat conductive adhesive tape 37 can be cured by a common method. For example, it may be cured by a method such as heat polymerization by means of a heat polymerization initiator, photopolymerization by means of a photopolymerization initiator or polymerization using a heat polymerization initiator and a curing accelerator. However, from the viewpoint of the productivity, etc., photopolymerization by means of a photopolymerization initiator is preferred.

EXAMPLES

Now, the present invention will be described with reference to Examples. However, it should be understood that the present invention is by no means restricted by such specific Examples.

Metal Base Circuit Board

Example 1-1

As shown in Table 1-1, to 100 parts by mass of a bisphenol A epoxy resin having an epoxy equivalent of 187 (EPICLON830-S, manufactured by Dainippon Ink and Chemicals Incorporated), 63 parts by mass of a polyoxypropylenediamine (mass ratio of D-40 to D-2000 was 6:4, manufactured by HARTZMAN) was added as a curing agent, and pulverized aluminum oxide having an average particle size of 2.2 μm and a maximum particle size of 20 μm (AL-173, manufactured by Showa Denko K.K.) was blended so that it would be 50 vol % in an insulating layer, and an insulating layer was formed on an aluminum foil having a thickness of 40 µm so that the thickness after the curing would be 100 µm. Then, an electrolytic copper foil having a thickness of 35 µm was bonded, followed by heating to thermally cure the insulating layer thereby to obtain a metal base board. Further, with the obtained metal base substrate, predetermined positions were masked with an etching resist, the copper foil was then subjected to etching, and then, the etching resist was removed to form a circuit thereby to obtain a metal base circuit board.

With respect to the obtained metal base circuit, (1) bendability at room temperature, (2) heat conductivity of the insulating layer, (3) bond strength between the conductive circuit and the insulating layer, (4) glass transition temperature of the insulating layer, (5) breakdown voltage of the insulating layer after heat treatment at 260° C. for 10 minutes, (6) withstand voltage of the insulating layer in a state bent at 90° at room temperature, (7) breakdown time of the insulating layer when a DC voltage of 1,000 V (pattern side +) was applied at 125° C., and (8) presence or absence of cracking in the insulating layer in a state bent at 90° at room temperature, were determined by the following methods.

The results are shown in Table 1-2. The obtained metal base circuit board was good in each physical property.

(1) The bendability at room temperature was evaluated in such a manner that the metal base circuit board was processed into 10 mm×100 mm, and one capable of being bent at an angle of at least 90° with a radius of curvature of 5 mm to the conductive circuit-formed surface side and the side opposite to the conductive circuit-formed surface by both hands in a temperature atmosphere of 25±1° C., was regarded as "good" and a case where it was necessary to use e.g. a bending die and press machine at the time of carrying out the bending, was regarded as "no good".

(2) Measurement of the heat conductivity was carried out in such a manner that the metal foil and the conductive circuit as base materials of the metal base circuit board were removed, and the insulating layer was processed into 10 mm in diameter×100 µm (partially 60 µm), and the heat conductivity was obtained by a laser flash method.

(3) The bond strength between the conductive circuit and the insulating layer was obtained by the method prescribed in JIS C6481 by processing the conductive circuit of the metal base circuit board into a strip with a width of 10 mm.

(4) Measurement of the glass transition temperature (Tg) was carried out in such a manner that the metal foil and the conductive circuit as base materials of the metal base circuit board were removed, the insulating layer was processed into 5 mm×50 mm×100 µm (partially 60 µm), and the glass transition temperature was obtained by a dynamic elasticity measuring method.

(5) Measurement of the withstand voltage of the insulating layer after heating at 260° C. for 10 minutes was carried out in such a manner that a metal base circuit board having a conductive circuit formed in a circular pattern of 20 mm in diameter was put in a solder tank heated at 260° C., treated for 10 minutes and then cooled to room temperature, whereupon the withstand voltage between the circular pattern and the aluminum foil was measured by a stepwise pressure raising method prescribed in JIS C2110.

(6) Measurement of the withstand voltage of the insulating layer in a state bent at 90° at room temperature was carried out in such a manner that a metal base circuit board having a conductive circuit formed in a circular pattern of 20 mm in diameter, was bent at 90° with a radius of curvature of 1 mm so that the circular pattern of 20 mm in diameter was contained, and in that bent state, the withstand voltage between the circular pattern and the aluminum foil was measured by a step wisely pressure-raising method prescribed in JIS C2110.

(7) Measurement of the breakdown time of the insulating layer when a DC voltage of 1,000 V (pattern side +) was applied at 125° C., was carried out in such a manner that by setting the circular pattern side of the metal base circuit board having the circuit board formed in the circular pattern of 20 mm in diameter, to be + and the metal foil side to be −, a DC voltage of 1,000 V was applied at 125° C., whereby the breakdown time of the insulating layer was measured.

(8) The presence or absence of cracking in the insulating layer in a state bent at 90° C. at room temperature, was visually observed.

Example 1-2

As shown in Table 1-1, to 100 parts by mass of a hydrogenated (in Table 1, identified by Hydrogenated) bisphenol A epoxy resin having an epoxy equivalent of 201 (YX-8000, manufactured by Japan Epoxy Resins Co., Ltd.), 63 parts by mass of a polyoxypropylenediamine (mass ratio of D-400 to D-2000 was 6:4, manufactured by HARTZMAN) was added as a curing agent, and pulverized aluminum oxide having an average particle size of 2.2 µm and a maximum particle size of 20 µm (AL-173, manufactured by Showa Denko K.K.) was blended so that it would be 50 vol % in an insulting layer, and an insulating layer was formed on an aluminum foil having a thickness of 40 µm so that the thickness after curing would be 100 µm. Then, an electrolytic copper foil having a thickness of 35 µm was bonded, followed by heating to thermally cure the insulating layer thereby to obtain a metal base board. Except for the above, in the same manner as in Example 1-1, a metal base circuit board was prepared, and various physical properties were measured.

The results are shown in Table 1-2. Due to a decrease of the glass transition temperature (Tg) of the insulating layer, the bendability at room temperature was remarkably improved. Other physical properties were also good.

Example 1-3

As shown in Table 1-1, to 100 parts by mass of an epoxy resin comprising 70 mass % of a hydrogenated bisphenol A epoxy resin having an epoxy equivalent of 201 (YX-8000, manufactured by Japan Epoxy Resins Co., Ltd.) and 30 mass % of a bisphenol A epoxy resin having an epoxy equivalent of 1,900 (YD-927H, manufactured by Tohto Kasei Co., Ltd.), 48 parts by mass of a polyoxypropylenediamine (mass ratio of D-400 to D-2000 was 6:4, manufactured by HARTZMAN) was added as a curing agent, and pulverized aluminum oxide having an average particle size of 2.2 µm and a maximum particle size of 20 µm (AL-173, manufactured by Showa Denko K.K.) was blended so that it would be 50 vol % in an insulting layer, and an insulating layer was formed on an aluminum foil having a thickness of 40 µm, so that the thickness after curing would be 100 µm. Then, an electrolytic copper foil having a thickness of 35 µm was bonded, followed by heating to thermally cure the insulating layer thereby to obtain a metal base board. Except for the above, in the same manner as in Example 1-1, a metal base circuit board was prepared, and various physical properties were measured.

The results are shown in Table 1-2. With the obtained metal base circuit board, the bond strength between the conductive circuit and the insulating layer was remarkably improved. Other physical properties were also good.

Example 1-4

As shown in Table 1-1, to 100 parts by mass of an epoxy resin comprising 70 mass % of a hydrogenated bisphenol A epoxy resin having an epoxy equivalent of 201 (YX-8000, manufactured by Japan Epoxy Resins Co., Ltd.) and 30 mass % of a hydrogenated bisphenol A epoxy resin having an epoxy equivalent of 1,024 (ST-4100D, manufactured by Tohto Kasei Co., Ltd.), 50 parts by mass of a polyoxypropylenediamine (mass ratio of D-400 to D-2000 was 6:4, manufactured by HARTZMAN) was added as a curing agent, and pulverized aluminum oxide having an average particle size of 2.2 μm and a maximum particle size of 20 μm (AL-173, manufactured by Showa Denko K.K.) was blended so that it would be 50 vol % in an insulting layer, and an insulating layer was formed on an aluminum foil having a thickness of 40 μm, so that the thickness after curing would be 100 μm. Then, an electrolytic copper foil having a thickness of 35 μm was bonded, followed by heating to thermally cure the insulating layer, thereby to obtain a metal base board. Except for the above, in the same manner as in Example 1-1, a metal base circuit board was prepared, and various physical properties were measured.

The results are shown in Table 1-2. With the obtained metal base circuit board, in addition to the bond strength between the conductive circuit and the insulating layer, the bendability at room temperature was remarkably improved due to a decrease in the glass transition temperature (Tg). Other physical properties were also good.

Example 1-5

As shown in Table 1-1, to 100 parts by mass of an epoxy resin comprising 70 mass %, based on the entire epoxy resin, of a hydrogenated bisphenol F epoxy resin having an epoxy equivalent of 181 (YL-6753, manufactured by Japan Epoxy Resins Co., Ltd.) and 30 mass % of a hydrogenated bisphenol A epoxy resin having an epoxy equivalent of 1,024 (ST-4100D, manufactured by Tohto Kasei Co., Ltd.), 55 parts by mass of a polyoxypropylenediamine (mass ratio of D-400 to D-2000 was 6:4, manufactured by HARTZMAN) was added as a curing agent, and pulverized aluminum oxide having an average particle size of 2.2 μm and a maximum particle size of 20 μm (AL-173, manufactured by Showa Denko K.K.) was blended so that it would be 50 vol % in an insulating layer, and an insulating layer was formed on an aluminum foil having a thickness of 40 μm, so that the thickness after curing would be 100 μm. Then, an electrolytic copper foil having a thickness of 35 μm was bonded, followed by heating to thermally cure the insulating layer, thereby to obtain a metal base board. Except for the above, in the same manner as in Example 1-1, a metal base circuit board was prepared, and various physical properties were measured.

The results are shown in Table 1-2. With the obtained metal base circuit board, in addition to the bond strength between the conductive circuit and the insulating layer, the bendability at room temperature was remarkably improved due to a decrease in the glass transition temperature (Tg).

Example 1-6

As shown in Table 1-1, to 100 parts by mass of an epoxy resin comprising 70 mass %, based on the entire epoxy resin, of a hydrogenated bisphenol A epoxy resin having an epoxy equivalent of 207 (EXA-7015, manufactured by Dainippon Ink and Chemicals Incorporated), and 30 mass % of a hydrogenated bisphenol A epoxy resin having an epoxy equivalent of 1,200 (YL-7170, manufactured by Japan Epoxy Resins Co., Ltd.), 48 parts by mass of a polyoxypropylenediamine (mass ratio of D-400 to D-2000 was 6:4, manufactured by HARTZMAN) was added as a curing agent, and pulverized aluminum oxide having an average particle size of 2.2 μm and a maximum particle size of 20 μm (AL-173, manufactured by Showa Denko K.K.) was blended so that it would be 50 vol % in an insulting layer, and an insulating layer was formed on an aluminum foil having a thickness of 40 μm, so that the chloride ion concentration would be 250 ppm in the entire thermosetting resin, and the thickness after curing would be 100 μm. Then, an electrolytic copper foil having a thickness of 35 μm was bonded, followed by heating to thermally cure the insulating layer thereby to obtain a metal base board. Except for the above, in the same manner as in Example 1-1, a metal base circuit board was prepared, and various physical properties were measured.

The results are shown in Table 1-2. With the obtained metal base circuit board, in addition to the bond strength between the conductive circuit and the insulating layer, the bendability at room temperature was remarkably improved due to a decrease in the glass transition temperature (Tg). Further, the breakdown time of the insulating layer when a DC voltage of 1,000 V (pattern side+) was applied at 125° C., was extended. Other physical properties were also good.

Example 1-7

As shown in Table 1-1, to 100 parts by mass of an epoxy resin comprising 70 mass %, based on the entire epoxy resin, of a hydrogenated bisphenol A epoxy resin having an epoxy equivalent of 207 (EXA-7015, manufactured by Dainippon Ink and Chemicals Incorporated) and 30 mass % of a hydrogenated bisphenol A epoxy resin having an epoxy equivalent of 1,200 (YL-7170, manufactured by Japan Epoxy Resins Co., Ltd.), 48 parts by mass of a polyoxypropylenediamine (mass ratio of D-400 to D-2000 was 6:4, manufactured by HARTZMAN) was added as a curing agent, and spherical coarse particles of aluminum oxide having a maximum particle size of at most 75 μm, an average particle size of 21 μm and a sodium ion concentration of 10 ppm (CB-A20, manufactured by Showa Denko K.K.) and spherical fine particles of aluminum oxide having an average particle size of 0.7 μm and a sodium ion concentration of 8 ppm (AKP-15, manufactured by Sumitomo Chemical Co., Ltd.) were blended so that the total amount would be 50 vol % in an insulating layer (mass ratio of spherical coarse particles to spherical fine particles was 7:3), and an insulating layer was formed on an aluminum foil having a thickness of 40 μm, so that the thickness after curing would be 100 μm. Then, an electrolytic copper foil having a thickness of 35 μm was bonded, followed by heating to thermally cure the insulating layer to obtain a metal base board having a chloride ion concentration in the insulating layer of at most 300 ppm based on the entire thermosetting resin and a sodium ion concentration in the insulating layer of at most 50 ppm based on the entire inorganic filler. Except for the above, in the same manner as in Example 1-1, a metal base circuit board was prepared, and the respective physical properties were measured.

The results are shown in Table 1-2. With the obtained metal base circuit board, the breakdown time of the insulating layer when a DC voltage of 1,000 V (pattern side+) was applied at 125° C., was remarkably extended, and other physical properties were also good.

Example 1-8

As shown in Table 1-1, to 100 parts by mass of an epoxy resin comprising 70 mass % of 170 ppm hydrogenated bisphenol A epoxy resin having an epoxy equivalent of 207 (EXA-7015, manufactured by Dainippon Ink and Chemicals Incorporated) and 30 mass % of a hydrogenated bisphenol A epoxy resin having an epoxy equivalent of 1,200 (YL-7170, manufactured by Japan Epoxy Resins Co., Ltd.), 48 parts by mass of a polyoxypropylenediamine (mass ratio of D-400 to D-2000 was 6:4, manufactured by HARTZMAN) was added as a curing agent, and spherical coarse particles of aluminum oxide having a maximum particle size of at most 75 μm, an average particle size of 21 μm and a sodium ion concentration of 10 ppm (CB-A20, manufactured by Showa Denko K.K.) and spherical fine particles of aluminum oxide having an average particle size of 0.7 μm and a sodium ion concentration of 8 ppm (AKP-15, manufactured by Sumitomo Chemical Co., Ltd.) were blended so that the total amount would be 66 vol % in an insulating layer (mass ratio of spherical coarse particles to spherical fine particles was 7:3), and an insulating layer was formed on an aluminum foil having a thickness of 40 μm, so that the thickness after curing would be 100 μm. Then, an electrolytic copper foil having a thickness of 35 μm was bonded, followed by heating to thermally cure the insulating layer to obtain a metal base board having a chloride ion concentration in the insulating layer of at most 300 ppm based on the entire thermosetting resin and a sodium ion concentration in the insulating layer of at most 60 ppm based on the entire inorganic filler. Except is for the above, in the same manner as in Example 1-1, the metal base circuit board was prepared, and various physical properties were measured.

The results are shown in Table 1-2. With the obtained metal base circuit board, the heat conductivity was further improved, and other physical properties were also good.

Comparative Example 1-1

As shown in Table 1-1, to 100 parts by mass of a bisphenol A epoxy resin having an epoxy equivalent of 187 (EPICLON 850-S, manufactured by Dainippon Ink and Chemicals Incorporated), 63 parts by mass of a polyoxypropylenediamine (mass ratio of D-400 to D-2000 was 6:4, manufactured by HARTZMAN) was added as a curing agent, and a pulverized aluminum oxide having an average particle size of 2.2 μm and a maximum particle size of 20 μm (AL-173, manufactured by Showa Denko K.K.) was blended so that it would be 80 vol % in an insulating layer, and an insulating layer was formed on an aluminum foil having a thickness of 400 μm, so that the thickness after curing would be 100 μm. Then, a copper foil having a thickness of 210 μm was bonded, followed by heating to thermally cure the insulating layer to obtain a metal base board. Except for the above, in the same manner as in Example 1-1, a metal base circuit board was prepared, and various physical properties were measured.

The results are shown in Table 1-2. The obtained metal base circuit board had no substantial bendability, could not be manually bent at room temperature and was bent at 90° by means of a bending die and a pressing machine. Further, the bond strength between the conductive circuit and the insulating layer was weak, and the withstand voltage of the insulating layer in a state bent at 90° at room temperature was extremely low. Further, the breakdown time of the insulating layer when a DC voltage of 1,000 V (pattern side+) was applied at 125° C., was also extremely short. Further, the heat conductivity was partially different, and its fluctuation was large.

Comparative Example 1-2

As shown in Table 1-1, to 100 parts by mass of a bisphenol A epoxy resin having an epoxy equivalent of 187 (EPICLON 850-S, manufactured by Dainippon Ink and Chemicals Incorporated), 63 parts by mass of a polyoxypropylenediamine (mass ratio of D-400 to D-2000 was 6:4, manufactured by HARTZMAN) was added as a curing agent, and a pulverized aluminum oxide having an average particle size of 57 μm and a maximum particle size of 90 μm (A-13-L, manufactured by Showa Denko K.K.) was blended so that it would be 50 vol % in an insulating layer, and an insulating layer was formed on an aluminum foil having a thickness of 40 μm, so that the thickness after curing would be 60 μm. Then, an electrolytic copper foil having a thickness of 35 μm was bonded, followed by heating to thermally cure the insulating layer thereby to obtain a metal base board. Except for the above, in the same manner as in Example 1-1, a metal base circuit board was prepared, and various physical properties were measured.

The results are shown in Table 1-2. With the obtained metal base circuit board, many irregularities which appeared to be projections of the alumina filler, were observed at the insulating layer-exposed portion on the conductive circuit surface, and cracking was observed in the insulating layer when bent at room temperature. Further, the bond strength between the conductive circuit and the insulating layer was weak, and the withstand voltage of the insulating layer in a state bent at 90° at room temperature was extremely low. Further, the breakdown time of the insulating layer when a DC voltage of 1,000 V (pattern side+) was applied at 125° C., was also extremely short.

Comparative Example 1-3

As shown in Table 1-1, to 100 parts by mass of an epoxy resin comprising 40 mass % of a bisphenol A epoxy resin having an epoxy equivalent of 187 (EPICLON 850-S, manufactured by Dainippon Ink and Chemicals Incorporated) and 60 mass % of a bisphenol A epoxy resin having an epoxy equivalent of 4,000 (EPIKOTE 1010, manufactured by Japan Epoxy Resins Co., Ltd.), 51 parts by mass of a polyoxypropylenediamine (mass ratio of D-400 to D-2000 was 6:4, manufactured by HARTZMAN) was added as a curing agent, and pulverized aluminum oxide having an average particle size of 2.2 μm and a maximum particle size of 20 μm (AL-173, manufactured by Showa Denko K.K.) was blended so that it would be 50 vol % in an insulating layer, and an insulating layer was formed on an aluminum foil having a thickness of 400 μm, so that the thickness after curing would be 100 μm. Then, an electrolytic copper foil having a thickness of 35 μm was bonded, followed by heating to thermally cure the insulating layer thereby to obtain a metal base board. Except for the above, in the same manner as in Example 1-1, a metal base circuit board was prepared, and various physical properties were measured.

The results are shown in Table 1-2. The obtained metal base circuit board had no substantial bendability and could not be manually bent at room temperature. It was bent at 90° by means of a bending die and a pressing machine, whereby the glass transition temperature (Tg) rose, and the bendability at room temperature was inadequate, and the withstand voltage of the insulating layer in a state bent at 90° at room temperature was remarkably low.

Comparative Example 1-4

As shown in Table 1-1, to 100 parts by mass of an epoxy resin comprising 70 mass % of a hydrogenated bisphenol A epoxy resin having an epoxy equivalent of 238 and a chloride ion concentration in the resin of 1,500 ppm (EPOLIGHT 4000, manufactured by KYOEISHA CHEMICAL CO., LTD.) and 30 mass % of a bisphenol F epoxy resin having an epoxy equivalent of 1,200 and a chloride ion concentration in the resin of 920 ppm (EPIKOTE 4004P, manufactured by Japan Epoxy Resins Co., Ltd.), 42 parts by mass of a polyoxypropylenediamine (mass ratio of D-400 to D-2000 was 6:4, manufactured by HARTZMAN) was added as a curing agent, and pulverized aluminum oxide having an average particle size of 2.2 µm and a maximum particle size of 20 µm (AL-173, manufactured by Showa Denko K.K.) was blended so that it would be 50 vol % in an insulating layer, and an insulating layer was formed on an aluminum foil having a thickness of 400 µm, so that the thickness after curing would be 100 µm, and the chloride ion concentration was 1,000 ppm based on the entire thermosetting resin. Then, an electrolytic copper foil having a thickness of 35 µm was bonded, followed by heating to thermally cure the insulating layer thereby to obtain a metal base board. Except for the above, in the same manner as in Example 1-1, a metal base circuit board was prepared, and various physical properties were measured.

The results are shown in Table 1-2. With the obtained metal base circuit board, the breakdown time of the insulating layer when a DC voltage of 1,000 V (pattern side+) was applied at 125° C., was extremely short.

Comparative Example 1-5

As shown in Table 1-1, to 100 parts by mass of an epoxy resin comprising 70 mass % of a hydrogenated bisphenol A epoxy resin having an epoxy equivalent of 238 and a chloride ion concentration in the resin of 1,500 ppm (EPOLIGHT 4000, manufactured by KYOEISHA CHEMICAL CO., LTD.) and 30 mass % of a bisphenol F epoxy resin having an epoxy equivalent of 1,200 and a chloride ion concentration in the resin of 920 ppm (EPIKOTE 4004P, manufactured by Japan Epoxy Resins Co., Ltd.), 63 parts by mass of a polyoxypropylenediamine (mass ratio of D-400 to D-2000 was 6:4, manufactured by HARTZMAN) was added as a curing agent, and spherical coarse particles of aluminum oxide having a maximum particle size of at most 75 µm, an average particle size of 25 µm and a sodium ion concentration of 530 ppm (AX-25, manufactured by MICRON Co., Ltd.) and spherical fine particles of aluminum oxide having an average particle size of 1.2 µm and a sodium ion concentration of 396 ppm (AW15-25, manufactured by MICRON Co., Ltd.) were blended so that the total amount would be 50 wt % in an insulating layer (mass ratio of spherical coarse particles to spherical fine particles was 7:3), and an insulating layer was formed on an aluminum foil having a thickness of 400 µm, so that the thickness after curing would be 100 µm. Then, an electrolytic copper foil having a thickness of 35 µm was bonded, followed by heating to thermally cure the insulating layer to obtain a metal base board having a chloride ion concentration of 1,000 ppm, based on the entire thermosetting resin, in the insulating layer and a sodium ion concentration of 500 ppm, based on the entire inorganic filler, in the insulating layer. Except for the above, in the same manner as in Example 1-1, a metal base circuit board was prepared, and various physical properties were measured.

The results are shown in Table 1-2. With the obtained metal base circuit board, the breakdown time of the insulating layer when a DC voltage of 1,000 V was applied at 125° C., was remarkably short.

The thickness of each layer of the metal base circuit substrate, the type and amount of the thermosetting resin, the contained chloride ion concentration, the type of the inorganic filler and the contained sodium ion concentration, are shown in Table 1-1.

Various physical properties of the prepared metal base circuit boards are shown in Table 1-2.

TABLE 1-1

| | Thickness of metal base circuit board | | | Types and amounts of thermosetting resins Epoxy resin (1) | | | |
|---|---|---|---|---|---|---|---|
| | Metal foil (µm) | Insulating layer (µm) | Conductive circuit (µm) | Type | Epoxy equivalent (g/eq) | Chloride ion concentration (ppm) | Content in epoxy resin (mass %) |
| Example 1-1 | 40 | 100 | 35 | Bisphenol A | 187 | 700 | 100 |
| Example 1-2 | 40 | 100 | 35 | Hydrogenated bisphenol A | 201 | 700 | 100 |
| Example 1-3 | 40 | 100 | 35 | Hydrogenated bisphenol A | 201 | 700 | 70 |
| Example 1-4 | 40 | 100 | 35 | Hydrogenated bisphenol A | 201 | 700 | 70 |
| Example 1-5 | 40 | 100 | 35 | Hydrogenated bisphenol F | 181 | 700 | 70 |
| Example 1-6 | 40 | 100 | 35 | Hydrogenated bisphenol A | 207 | 170 | 70 |
| Example 1-7 | 40 | 100 | 35 | Hydrogenated bisphenol A | 207 | 170 | 70 |
| Example 1-8 | 40 | 100 | 35 | Hydrogenated bisphenol A | 207 | 170 | 70 |
| Comparative Example 1-1 | 400 | 100 | 210 | Bisphenol A | 187 | 700 | 100 |
| Comparative Example 1-2 | 40 | 60 | 35 | Bisphenol A | 187 | 700 | 100 |
| Comparative Example 1-3 | 400 | 100 | 35 | Bisphenol A | 187 | 700 | 40 |
| Comparative Example 1-4 | 400 | 100 | 35 | Hydrogenated bisphenol A | 238 | 1500 | 70 |
| Comparative Example 1-5 | 400 | 100 | 35 | Hydrogenated bisphenol A | 238 | 1500 | 70 |

TABLE 1-1-continued

| | Types and amounts of thermosetting resins | | | Chloride ion concentration in thermosetting resin (ppm) |
|---|---|---|---|---|
| | Epoxy resin (2) | | | |
| | Type | Epoxy equivalent (g/eq) | Chloride ion concentration (ppm) | Content in epoxy resin (mass %) | |

| | Type | Epoxy equivalent (g/eq) | Chloride ion concentration (ppm) | Content in epoxy resin (mass %) | Chloride ion concentration in thermosetting resin (ppm) |
|---|---|---|---|---|---|
| Example 1-1 | — | — | — | — | 450 |
| Example 1-2 | — | — | — | — | 460 |
| Example 1-3 | Bisphenol A | 1900 | 630 | 30 | 490 |
| Example 1-4 | Hydrogenated bisphenol A | 1024 | 810 | 30 | 500 |
| Example 1-5 | Hydrogenated bisphenol A | 1024 | 810 | 30 | 500 |
| Example 1-6 | Hydrogenated bisphenol A | 1200 | 250 | 30 | 180 |
| Example 1-7 | Hydrogenated bisphenol A | 1200 | 250 | 30 | 180 |
| Example 1-8 | Hydrogenated bisphenol A | 1200 | 250 | 30 | 180 |
| Comparative Example 1-1 | — | — | — | — | 450 |
| Comparative Example 1-2 | — | — | — | — | 450 |
| Comparative Example 1-3 | Bisphenol A | 4000 | 700 | 60 | 480 |
| Comparative Example 1-4 | Bisphenol F | 1200 | 920 | 30 | 1000 |
| Comparative Example 1-5 | Bisphenol F | 1200 | 920 | 30 | 1000 |

| | Inorganic filler (aluminum oxide) | | | | Content of inorganic filler in insulating layer (vol %) |
|---|---|---|---|---|---|
| | Inorganic filler (1) | | Inorganic filler (2) | | |
| | Type | Sodium ion concentration (ppm) | Type | Sodium ion concentration (ppm) | |
| Example 1-1 | Pulverized | 230 | — | — | 50 |
| Example 1-2 | Pulverized | 230 | — | — | 50 |
| Example 1-3 | Pulverized | 230 | — | — | 50 |
| Example 1-4 | Pulverized | 230 | — | — | 50 |
| Example 1-5 | Pulverized | 230 | — | — | 50 |
| Example 1-6 | Pulverized | 230 | — | — | 50 |
| Example 1-7 | Spherical coarse particles | 10 | Spherical fine particles | 8 | 50 |
| Example 1-8 | Spherical coarse particles | 10 | Spherical fine particles | 8 | 66 |
| Comparative Example 1-1 | Pulverized | 230 | — | — | 80 |
| Comparative Example 1-2 | Pulverized | 230 | — | — | 50 |
| Comparative Example 1-3 | Pulverized | 230 | — | — | 50 |
| Comparative Example 1-4 | Pulverized | 230 | — | — | 50 |
| Comparative Example 1-5 | Spherical coarse particles | 530 | Spherical fine particles | 396 | 50 |

TABLE 1-2

| | Bendability at room temperature | Heat conductivity of insulating layer (W/mK) | Bond strength between conductive circuit and insulting layer (N/cm$^2$) | Glass transition temperature of insulating layer (Tg) (° C.) |
|---|---|---|---|---|
| Example 1-1 | Good | 2.0 | 16.0 | 38.0 |
| Example 1-2 | Good | 2.0 | 10.0 | 8.0 |
| Example 1-3 | Good | 2.0 | 25.0 | 28.0 |
| Example 1-4 | Good | 2.0 | 23.0 | 18.0 |
| Example 1-5 | Good | 2.0 | 22.0 | 16.0 |
| Example 1-6 | Good | 2.0 | 20.0 | 20.0 |
| Example 1-7 | Good | 2.0 | 20.0 | 20.0 |
| Example 1-8 | Good | 4.0 | 20.0 | 21.0 |

TABLE 1-2-continued

| | | | | |
|---|---|---|---|---|
| Comparative Example 1-1 | No good | 3.0 | 5.1 | 38.0 |
| Comparative Example 1-2 | No good | 2.0 | 20.0 | 38.0 |
| Comparative Example 1-3 | No good | 2.0 | 20.3 | 80.0 |
| Comparative Example 1-4 | No good | 2.0 | 18.1 | 20.0 |
| Comparative Example 1-5 | No good | 2.0 | 17.5 | 20.0 |

| | Breakdown voltage after heat treatment at 260° C. for 10 min. (kV) | Breakdown voltage in a state bent at 90° at room temperature (kV) | Breakdown time when DC voltage of 1,000 V was applied at 125° C. (hr) | Presence or absence of cracking in the insulating layer when bent at 90° at room temperature |
|---|---|---|---|---|
| Example 1-1 | 4.0 | 4.0 | 1200 | Absent |
| Example 1-2 | 3.5 | 4.0 | 1050 | Absent |
| Example 1-3 | 4.0 | 4.0 | 1300 | Absent |
| Example 1-4 | 4.0 | 3.8 | 1020 | Absent |
| Example 1-5 | 4.0 | 4.0 | 1030 | Absent |
| Example 1-6 | 3.5 | 2.5 | 51000 | Absent |
| Example 1-7 | 4.5 | 5.0 | 103000 | Absent |
| Example 1-8 | 3.5 | 4.0 | 98000 | Absent |
| Comparative Example 1-1 | 1.2 | 0.5 | 490 | Present |
| Comparative Example 1-2 | 1.3 | 0.8 | 510 | Present |
| Comparative Example 1-3 | 3.0 | 0.5 | 1210 | Present |
| Comparative Example 1-4 | 1.0 | 0.7 | 302 | Absent |
| Comparative Example 1-5 | 1.0 | 0.7 | 194 | Absent |

Multilayer Circuit Board

Example 2-1

To 100 parts by mass of an epoxy resin comprising 70 mass %, based on the entire epoxy resin, of a hydrogenated bisphenol A epoxy resin having an epoxy equivalent of 201 ("XY-8000", manufactured by Japan Epoxy Resins Co., Ltd.) and 30 mass % of a hydrogenated bisphenol A epoxy resin having an epoxy equivalent of 1,200 ("YL-7170", manufactured by Japan Epoxy Resins Co., Ltd.), 48 parts by mass of a polyoxypropylenediamine (mass ratio of "D-400" to "D-2000" was 6:4, manufactured by HARTZMAN) was added as a curing agent, and spherical coarse particles of aluminum oxide having a maximum particle size of at most 75 μm and an average particle size of 21 μm ("CB-A20", manufactured by Showa Denko K.K.) and spherical fine particles of aluminum oxide having an average particle size of 0.6 μm ("AO-802", manufactured by Admatechs Corporation) were blended so that the total amount would be 50 vol % in an insulating layer (mass ratio of spherical coarse particles to spherical fine particles was 6:4), and an insulating layer was formed on a copper foil having a thickness of 35 μm, so that the thickness after curing would be 100 μm. Then, a copper foil having a thickness of 35 μm was bonded, followed by heating to thermally cure the insulating layer to obtain an inner layer foil-laminated board.

Further, with respect to the obtained board, predetermined positions were masked with a dry film, and the copper foil was subjected to etching. Then, the dry film was removed to form a circuit thereby to obtain an inner layer circuit board.

Using the obtained inner layer circuit board as a base, the above insulating layer and a copper foil having a thickness of 35 μm were bonded, followed by heating and curing to obtain a multilayer board.

Then, at predetermined positions of the outer circuit, holes having a diameter of 0.5 mm were drilled to pass through the inner layer circuit and the outer layer circuit, and then copper plating was applied to form through-holes. On this surface, an outer layer circuit was formed by etching by the above-mentioned is method to form a multilayer circuit board.

With respect to the multilayer circuit board, (1) the heat conductivity of the insulating layer, (2) the glass transition point of the insulting layer, (3) the withstand voltage at the time of bending, (4) bendability and (5) operation stability of a power element, were measured and evaluated by the following methods.

(1) Measurement of Heat Conductivity of Insulating Layer

The insulating layer of a circuit board was separately prepared in the form of a circular disk cured product having a diameter of 10 mm and a thickness of 2 mm, and the heat conductivity was obtained by a laser flash method.

(2) Glass Transition Point of Insulting Layer

Using a single layer circuit board prior to multilayer processing, the metal foil and the conductive circuit as base materials were removed by etching, and the insulating layer taken out, was processed into 5 mm×50 mm, and the glass transition point was obtained by a dynamic visco-elasticity measuring method.

(3) Withstand Voltage at the Time of Bending

The multilayer circuit board having the outer layer circuit formed in a circular pattern having a diameter of 20 mm, was bent at 90° with a radius of curvature of 1 mm so that the circular pattern having a diameter of 20 mm was contained, and in this bent state, the withstand voltage between the inner layer circular and the aluminum foil was measured by a stepwise pressure raising method prescribed in JIS C2110.

(4) Bendability at Room Temperature

The multilayer circuit board (one having a conductive foil over the entire surface without forming a circuit pattern on the inner or outer layer, was used) was processed into 10 mm×100 mm, and one capable of being bent at an angle of at least 90° C. with a radius of curvature of 5 mm to the conductor circuit-formed surface side and to the side opposite to the conductive circuit-formed surface by both hands in a temperature atmosphere of 25±1° C., was regarded as "Good", and a case where it was necessary to use a bending die and a pressing machine, etc. at the time of carrying out bending, was regarded as "No good".

(5) Operation Stability of Power Element

A module having three p-mos-FET (2SK2174S) manufactured by Hitachi, Ltd. mounted with a space of 2 mm, was prepared and continuously operated for 96 hours in an environment of 100° C. with power consumption of 10 W per element, whereby presence or absence of malfunction was evaluated. In a case where no malfunction occurred, power consumption of 10 W was further added, and evaluation was made again, and by the power consumption when malfunction occurred, the operation stability of the power element was evaluated.

The results are shown in Table 2-1.

TABLE 2-1

|  | Heat conductivity of insulating layer (W/mK) | Glass transition temperature of insulating layer (Tg) (° C.) | Bendability at room temperature | Breakdown voltage in a state bent at 90° at room temperature (kV) | Operation stability of electron element (W) |
|---|---|---|---|---|---|
| Example 2-1 | 2.0 | 20.0 | Good | 5.0 | >50 |
| Example 2-2 | 4.0 | 21.0 | Good | 4.0 | >50 |
| Example 2-3 | 2.0 | 38.0 | Good | 4.0 | >50 |
| Example 2-4 | 2.0 | 8.0 | Good | 4.0 | >50 |
| Comparative Example 2-1 | 2.0 | 38.0 | No good | 0.5 | >50 |
| Comparative Example 2-2 | 2.0 | 38.0 | No good | 0.8 | >50 |

Example 2-2

A multilayer circuit board was prepared in the same manner as in Example 2-1 and evaluated in the same manner as in Example 2-1, except that the composition of the insulating layer was such that to 100 parts by mass of an epoxy resin comprising 70 mass % of a hydrogenated bisphenol A epoxy resin having an epoxy equivalent of 201 ("YX-800", manufactured by Japan Epoxy Resins Co., Ltd.) and 30 mass % of a hydrogenated bisphenol A epoxy resin having an epoxy equivalent of 1,200 ("YL-7170", manufactured by Japan Epoxy Resins Co., Ltd.), 48 parts by mass of a polyoxypropylenediamine (mass ratio of "D-400" to "D-2000" was 6:4, manufactured by HARTZMAN) was added as a curing agent, and spherical coarse particles of aluminum oxide having a maximum particle size of at most 75 μm and an average particle size of 21 μm ("CB-A20", manufactured by Showa Denko K.K.) and spherical fine particles of aluminum oxide having an average particle size of 0.6 μm ("AO-802", manufactured by Admatechs Corporation) were blended so that the total amount would be 65 vol % in the insulating layer (mass ratio of spherical coarse particles to spherical fine particles was 6:4). The evaluation results are shown in Table 2-1.

Example 2-3

A multilayer circuit board was prepared in the same manner as in Example 2-1 and evaluated in the same manner as in Example 2-1, except that to 100 parts by mass of a bisphenol A epoxy resin having an epoxy equivalent of 187 ("EPICLON 850-S", manufactured by Dainippon Ink and Chemicals Incorporated), 63 parts by mass of a polyoxypropylenediamine (mass ratio of "D-400" to "D-2000" was 6:4, manufactured by HARTZMAN) was added as a curing agent, and spherical coarse particles of aluminum oxide having a maximum particle size of at most 75 μm and an average particle size of 21 μm ("CB-A20", manufactured by Showa Denko K.K.) and spherical fine particles of aluminum oxide having an average particle size of 0.6 μm ("AO-802", manufactured by Admatechs Corporation) were blended so that the total amount would be 50 vol % in the insulating layer (mass ratio of spherical coarse particles to spherical fine particles was 6:4). The evaluation results are shown in Table 2-1.

Example 2-4

A multilayer circuit board was prepared in the same manner as in Example 2-1 and evaluated in the same manner as in Example 2-1, except that to 100 parts by mass of a hydrogenated bisphenol A epoxy resin having an epoxy equivalent of 201 ("YX-8000", manufactured by Japan Epoxy Resins Co., Ltd.), 60 parts by mass of a polyoxypropylenediamine (mass ratio of "D-400" to "D-2000" was 6:4, manufactured by HARTZMAN) was added as a curing agent, and spherical coarse particles of aluminum oxide having a maximum particle size of at most 75 μm and an average particle size of 21 μm ("CB-A20", manufactured by Showa Denko K.K.) and spherical fine particles of aluminum oxide having an average particle size of 0.6 μm ("AO-802", manufactured by Admatechs Corporation) were blended so that the total amount would be 50 volt in the insulating layer (mass ratio of spherical coarse particles to spherical fine particles was 6:4). The evaluation results are shown in Table 2-1.

Comparative Example 2-1

A multilayer circuit board was prepared in the same manner as in Example 2-1 and evaluated in the same manner as in Example 2-1, except that to 100 parts by mass of a bisphenol A epoxy resin having an epoxy equivalent of 187 ("EPICLON 850-S", manufactured by Dainippon Ink and Chemicals Incorporated), 63 parts by mass of a polyoxypropylenediamine (mass ratio of "D-400" to "D-2000" was 6:4, manufactured by HARTZMAN) was added as a curing agent, and spherical coarse particles of aluminum oxide having a maximum particle size of at most 75 μm and an average particle size of 21 μm ("CB-A20", manufactured by Showa Denko K.K.) and spherical fine particles of aluminum oxide having an average particle size of 0.6 μm ("AO-802", manufactured by Admatechs Corporation) were blended so that the total amount would be 80 vol % in the insulating layer (mass ratio of spherical coarse particles to spherical fine particles was 6:4). The evaluation results are shown in Table 2-1. The obtained multilayer circuit board had no substantial bendability and could not be manually bent at room temperature, and it was bent at 90° by means of a bending die and a press machine. Further, the withstand voltage became low.

Comparative Example 2-2

A multilayer circuit board was prepared in the same manner as in Example 2-1 and evaluated in the same manner as in Example 2-1, except that the insulating layer was formed on an Al plate having a thickness of 1,500 μm. The evaluation results are shown in Table 2-1. The obtained multilayer circuit board had no substantial bendability and could not be manually bent at room temperature, and it was bent at 90° by means of a bending die and a press machine. Various properties of the multilayer circuit board are shown in Table 2-1.

LED Module

Example 3-1

To 100 parts by mass of an epoxy resin comprising 70 mass %, based on the entire epoxy resin, of a hydrogenated bisphenol A epoxy resin having an epoxy equivalent of 207 ("EXA-7015", manufactured by Dainippon Ink and Chemicals Incorporated) and 30 mass % of a hydrogenated bisphenol A epoxy resin having an epoxy equivalent of 1,200 ("YL-7170", manufactured by Japan Epoxy Resins Co., Ltd.), 48 parts by mass of a polyoxypropylenediamine (mass ratio of "D-400" to "D-2000" was 6:4, manufactured by HARTZMAN) was added as a curing agent, and spherical coarse particles of aluminum oxide having a maximum particle size of at most 30 μm, an average particle size of 10 μm and a sodium ion concentration of 90 ppm ("DAW-10", manufactured by Denki Kagaku Kogyo Kabushiki Kaisha) and spherical fine particles of aluminum oxide having an average particle size of 0.7 μm and a sodium ion concentration of 8 ppm ("AKP-15", manufactured by Sumitomo Chemical Co., Ltd.) were blended so that the total amount would be 50 vol % in an insulating layer (mass ratio of spherical coarse particles to spherical fine particles was 7:3), and an insulating layer was formed on a copper foil having a thickness of 18 μm, so that the thickness after curing would be 50 μm.

Then, a copper foil having a thickness of 18 μm was bonded, followed by heating to thermally cure the insulating layer, to obtain a metal base board having a chloride ion concentration of at most 300 ppm, based on the entire thermosetting resin in the insulating layer and a sodium ion concentration of at most 50 ppm, based on the entire inorganic filler in the insulating layer.

With respect to the metal base board, predetermined positions were masked with an etching resist, and the copper foil was subjected to etching. Then, the etching resist was removed to form a circuit thereby to obtain a metal base circuit board. Thereafter, a coverlay having a thickness of 12.5 μm ("NIKAFLEX CKSE", manufactured by NIKKAN INDUSTRIES CO., LTD.) was bonded to the metal base circuit board other than the component-mounted portion and the input terminal portion, to reinforce the board.

Then, by means of a press-punching apparatus provided with a Thompson die having the same shape as the desired slit shape, the metal foil, the insulating layer and the coverlay were partially removed at the portion where the conductive circuit and electrodes were not formed, to process 80% relative to the length of the bending portion thereby to obtain a metal base circuit board capable of being easily bent including the processed slit portion.

Further, a cream solder ("M705", manufactured by Senju Metal Industry Co., Ltd.) was applied to electrodes at the component-mounting portion of the metal base circuit board by screen printing, and LED ("NFSW036B", manufactured by Nichia Corporation) was mounted by solder reflow. Thereafter, by means of a bending jig made of stainless steel processed to have a width of 200 mm, a thickness of 0.6 mm and a radius of curvature of one side being 0.3 mm, the metal base circuit board was bent with a radius of curvature of 0.3 mm so that the slit portion of the metal base circuit board was included, and fixed to an aluminum case having a thickness of 1 mm by means of a heat conductive adhesive tape, to obtain a LED module.

By the following methods, (1) tensile strength at room temperature, (2) bendability at room temperature, (3) evaluation of conductive circuit, (4) withstand voltage at the time of bending, and (5) electromagnetic wave-absorbing properties were measured.

(1) Tensile Strength at Room Temperature

The metal base circuit board was processed into 10 mm×100 mm, and in a temperature atmosphere of 25±1° C., the strength at the time of breakage of the metal base circuit board, was measured by a Tensilon tensile strength tester and taken as the tensile strength.

(2) Bendability at Room Temperature

The metal base circuit board was processed into 10 mm×100 mm, and in a temperature atmosphere of 25±1° C., one capable of being bent at an angle of at least 90° with a radius of curvature of 0.5 mm to the conductive circuit-formed surface side and the side opposite to the conductive circuit-formed surface by both hands, was regarded as "Good", and a case where it was necessary to use a bending die and a press machine at the time of carrying out the bending, was regarded as "No good".

(3) Evaluation of Conductive Circuit

In a temperature atmosphere of 25±1° C., a stabilized power source was connected to the obtained LED module, and LED was illuminated for at least 1 hour by conducting an electric current of 150 mA under a voltage of 10 V. A case where LED was illuminated for at least 1 hour at that time, was regarded as "Good", and a case where LED was not illuminated or illuminated for less than 1 hour, was regarded as "No good".

(4) Withstand Voltage at the Time of Bending

In a state where the metal base circuit board was bent at 90° with a radius of curvature of 0.3 mm, the withstand voltage between the conductive circuit and the base metal foil (Cu foil) was measured by a stepwise pressure-raising method as prescribed in JIS C2110.

(5) Electromagnetic Wave-Absorbing Properties

With respect the obtained board, the electromagnetic wave-absorbing properties were measured at frequencies of 300 MHz and 1 GHz by means of a network analyzer (8517D, manufactured by Agilent Technologies). For the absorbing properties, the absorption ratio (Ploss/Pin) was calculated from the results of measurement of reflection signal S11 and transmission signal S21 of magnetic waves on line by means of a microstrip line method.

The results are shown in Table 3-1.

TABLE 3-1

|  | Tensile strength at room temperature (N/mm²) | Bendability at room temperature | Evaluation of conductive circuit | Withstand voltage at the time of bending (kV) | Electromagnetic wave-absorbing properties (300 MHz band) | Electromagnetic wave-absorbing properties (1 GHz band) |
| --- | --- | --- | --- | --- | --- | --- |
| Example 3-1 | 410 | Good | Good | 2.1 | 0 | 0 |
| Example 3-2 | 430 | Good | Good | 2.0 | 0.3 | 0.5 |
| Example 3-3 | 415 | Good | Good | 2.3 | 0.4 | 0.6 |
| Comparative Example 3-1 | 180 | Good | No good | 0.5 | 0 | 0 |
| Comparative Example 3-2 | 400 | No good | Good | 2.1 | 0 | 0 |
| Comparative Example 3-3 | 430 | Good | Good | 2.0 | 0.05 | 0.2 |
| Comparative Example 3-4 | 410 | Good | Good | 2.3 | 0.1 | 0.2 |

Example 3-2

To 100 parts by mass of an epoxy resin comprising 70 mass %, based on the entire epoxy resin, of a hydrogenated bisphenol A epoxy resin having an epoxy equivalent of 207 ("EXA-7015", manufactured by Dainippon Ink and Chemicals Incorporated) and 30 mass % of a hydrogenated bisphenol A epoxy resin having an epoxy equivalent of 1,200 ("YL-7170", manufactured by Japan Epoxy Resins Co., Ltd.), 48 parts by mass of a polyoxypropylenediamine (mass ratio of "D-400" to "D-2000" was 6:4, manufactured by HARTZMAN) was added as a curing agent, and spherical coarse particles of aluminum oxide having a maximum particle size of at most 30 μm, an average particle size of 10 μm and a sodium ion concentration of 90 ppm ("DAW-10", manufactured by Denki Kagaku Kogyo Kabushiki Kaisha) and spherical fine particles of aluminum oxide having an average particle size of 0.7 μm and a sodium ion concentration of 8 ppm ("AKP-15", manufactured by Sumitomo Chemical Co., Ltd.) were blended so that the total amount would be 50 vol % in an insulating layer (mass ratio of spherical coarse particles to spherical fine particles was 7:3), and an insulating layer was formed on a copper foil having a thickness of 18 μm, so that the thickness after curing would be 50 μm.

Then, a copper foil having a thickness of 18 μm was bonded, followed by heating to thermally cure the insulating layer thereby to obtain a metal base board having a chloride ion concentration of at most 300 ppm, based on the entire thermosetting resin in the insulating layer and a sodium ion concentration of at most 50 ppm, based on the entire inorganic filler in the insulating layer.

With respect to the metal base board, predetermined positions were masked with an etching resist, and the copper foil was subjected to etching. Then, the etching resist was removed to form a circuit thereby to obtain a metal base circuit board. Thereafter, a coverlay having a thickness of 12.5 μm ("NIKAFLEX CKSE", manufactured by NIKKAN INDUSTRIES CO., LTD.) was bonded to the metal base circuit board other than the component-mounted portion and the input terminal portion, to reinforce the board.

Then, a layer having a magnetic loss made of a magnetic material having an aspect ratio of 4 and an organic binder material, and having a content of the magnetic material of 50 vol % and a thickness of 30 μm, was formed on the top surface of the coverlay.

Then, by means of a bending jig made of stainless steel processed to have a width of 200 mm, a thickness of 0.6 mm and a radius of curvature of 0.3 mm on one side, the metal foil, the insulating layer, the coverlay and the layer having a magnetic loss, were partially removed at the portion where the conductive circuit and electrodes were not formed, to process 80% relative to the length of the bending portion, thereby to obtain a metal base circuit board capable of being easily bent including the processed slit portion.

Then, a cream solder ("M705", manufactured by Senju Metal Industry Co., Ltd.) was applied to electrodes at the component-mounting portion of the metal base circuit board by screen printing, and LED ("NFSW036B", manufactured by Nichia Corporation) was mounted by solder reflow. Thereafter, the metal base circuit board was bent with a radius of curvature of 0.3 mm so that the slit portion of the metal base circuit board would be included, and fixed to an aluminum case having a thickness of 1 mm by means of a heat conductive adhesive tape, thereby to obtain a LED module Evaluation was carried out in the same manner as in Example 3-1, and the results are shown in Table 3-1.

Example 3-3

To 100 parts by mass of an epoxy resin comprising 70 mass %, based on the entire epoxy resin, of a hydrogenated bisphenol A epoxy resin having an epoxy equivalent of 207 ("EXA-7015", manufactured by Dainippon Ink and Chemicals Incorporated) and 30 mass % of a hydrogenated bisphenol A epoxy resin having an epoxy equivalent of 1,200 ("YL-7170", manufactured by Japan Epoxy Resins Co., Ltd.), 48 parts by mass of a polyoxypropylenediamine (mass ratio of "D-400" to "D-2000" was 6:4, manufactured by HARTZMAN) was added as a curing agent, and spherical coarse particles of aluminum oxide having a maximum particle size of at most 30 μm, an average particle size of 10 μm and a sodium ion concentration of 90 ppm ("DAW-10", manufactured by Denki Kagaku Kogyo Kabushiki Kaisha) and spherical fine particles of aluminum oxide having an average particle size of 0.7 μm and a sodium ion concentration of 8 ppm ("AKP-15", manufactured by Sumitomo Chemical Co., Ltd.) were blended so that the total amount would be 50 vol % in an insulating layer (mass ratio of spherical coarse particles to spherical fine particles was 7:3), and an insulating layer was formed on a copper foil having a thickness of 18 μm, so that the thickness after curing would be 0 μm.

Then, a copper foil having a thickness of 18 μm was bonded, followed by heating to thermally cure the insulating layer thereby to obtain a metal base board having a chloride ion concentration of at most 300 ppm, based on the entire thermosetting resin in the insulating layer and a sodium ion concentration of at most 50 ppm, based on the entire inorganic filler in the insulating layer.

With respect to the metal base board, predetermined positions were masked with an etching resist, and the copper foil was subjected to etching. Then, the etching resist was removed to form a circuit thereby to obtain a metal base circuit board. Thereafter, a coverlay having a thickness of 12.5 μm ("NIKAFLEX CKSE", manufactured by NIKKAN INDUSTRIES CO., LTD.) was bonded to the metal base circuit board other than the component-mounted portion and the input terminal portion, to reinforce the board.

Then, a layer having a dielectric loss made of a carbon powder being boron-solid-solubilized carbon black having a specific surface area of 100 $m^2/g$ and an electrical resistivity of at most 0.1 Ωcm by JIS K1469, and an organic binder material, and having a content of the carbon powder of 50 vol % and a thickness of 30 μm, was formed on the top surface of the coverlay.

Then, by means of a bending jig made of stainless steel processed to have a width of 200 mm, a thickness of 0.6 mm and a radius of curvature of 0.3 mm on one side, the metal foil, the insulating layer, the coverlay and the layer having a dielectric loss, were partially removed at the portion where the conductive circuit and electrodes were not formed, to process 80% relative to the length of the bending portion, thereby to obtain a metal base circuit board capable of being easily bent including the processed slit portion.

Then, a cream solder ("M705", manufactured by Senju Metal Industry Co., Ltd.) was applied to electrodes at the component-mounting portion of the metal base circuit board by screen printing, and LED ("NFSW036B", manufactured by Nichia Corporation) was mounted by solder reflow. Thereafter, the metal base circuit board was bent with a radius of curvature of 0.3 mm so that the slit portion of the metal base circuit board would be included, and fixed to an aluminum case having a thickness of 1 mm by means of a heat conductive adhesive tape, to obtain a LED module. Evaluation was carried out in the same manner as in Example 3-1, and the results are shown in Table 3-1.

Comparative Example 3-1

A metal base circuit board was obtained by carrying out the same treatment as in Example 3-1 except that no reinforcement of the board by bonding a coverlay, and no slit processing at the bending portion, were carried out.

Then, a cream solder ("M705", manufactured by Senju Metal Industry Co., Ltd.) was applied to electrodes at the component-mounting portion of the metal base circuit board by screen printing, and LED ("NFSW036B", manufactured by Nichia Corporation) was mounted by solder reflow. Thereafter, the metal base circuit board was bent with a radius of curvature of 0.3 mm and fixed to an aluminum case having a thickness of 1 mm by means of a heat conductive adhesive tape, to obtain a LED module. Evaluation was carried out in the same manner as in Example 3-1, and the results are shown in Table 3-1.

Comparative Example 3-2

A metal base circuit board was obtained by carrying out the same treatment as in Example 3-1 except that no slit processing at the bending portion was carried out.

Then, a cream solder ("M705", manufactured by Senju Metal Industry Co., Ltd.) was applied to electrodes at the component-mounting portion of the metal base circuit board by screen printing, and LED ("NFSW036B", manufactured by Nichia Corporation) was mounted by solder reflow. Thereafter, the metal base circuit board was bent with a radius of curvature of 0.3 mm and fixed to an aluminum case having a thickness of 1 mm by means of a heat conductive adhesive tape, to obtain a LED module. Evaluation was carried out in the same manner as in Example 3-1, and the results are shown in Table 3-1.

Comparative Example 3-3

A metal base circuit board was obtained by carrying out the same treatment as in Example 3-2 except a layer having a magnetic loss, made of a magnetic material having an aspect ratio of 1, and an organic binder material, and having a thickness of 2 μm and a content of the magnetic material of 20 vol %, was formed on the top surface of the coverlay.

Then, a cream solder ("M705", manufactured by Senju Metal Industry Co., Ltd.) was applied to electrodes at the component-mounting portion of the metal base circuit board by screen printing, and LED ("NFSW036B", manufactured by Nichia Corporation) was mounted by solder reflow. Thereafter, the metal base circuit board was bent with a radius of curvature of 0.3 mm so that the slit portion of the metal base circuit board would be included, and fixed to an aluminum case having a thickness of 1 mm by means of a heat conductive adhesive tape, to obtain a LED module. Evaluation was carried out in the same manner as in Example 3-1, and the results are shown in Table 3-1.

Comparative Example 3-4

A metal base circuit board was obtained by carrying out the same treatment as in Example 3-3 except that a layer having a dielectric loss, made of a carbon powder being boron-solid-solubilized carbon black having a specific surface area of 10 $m^2/g$ and a volume resistivity of 0.2 Ωcm by JIS K1469, and an organic binder material, and having a content of the carbon powder of 4 vol % and a thickness of 2 μm, was formed on the top surface of the coverlay.

Then, a cream solder ("M705", manufactured by Senju Metal Industry Co., Ltd.) was applied to electrodes at the component-mounting portion of the metal base circuit board by screen printing, and LED ("NFSW036B", manufactured by Nichia Corporation) was mounted by solder reflow. Thereafter, the metal base circuit board was bent with a radius of curvature of 0.3 mm so that the slit portion of the metal base circuit board would be included, and fixed to an aluminum case having a thickness of 1 mm by means of a heat conductive adhesive tape, to obtain a LED module. Evaluation was carried out in the same manner as in Example 3-1, and the results are shown in Table 3-1.

Light Source Unit

Example 4-1

To 100 parts by mass of an epoxy resin comprising 70 mass %, based on the entire epoxy resin, of a hydrogenated bisphenol A epoxy resin having an epoxy equivalent of 207 ("EXA-7015", manufactured by Dainippon Ink and Chemicals Incorporated) and 30 mass % of a hydrogenated bisphenol A epoxy resin having an epoxy equivalent of 1,200 ("YL-7170", manufactured by Japan Epoxy Resins Co., Ltd.), 48 parts by mass of a polyoxypropylenediamine (mass ratio of "D-400" to "D-2000" was 6:4, manufactured by HARTZMAN) was added as a curing agent, and spherical coarse particles of aluminum oxide having a maximum particle size of at most 75 μm, an average particle size of 21 μm and a sodium ion concentration of 10 ppm ("CB-A20", manufactured by Showa Denko K.K.) and spherical fine particles of aluminum oxide having an average particle size of 0.7 μm and a sodium ion concentration of 8 ppm ("AKP-15, manufactured by Sumitomo Chemical Co., Ltd.) were blended so that the total amount would be 50 vol % in an insulating layer (mass ratio of spherical coarse particles to spherical fine particles was 7:3), and an insulating layer was formed on a copper foil having a thickness of 35 μm, so that the thickness after curing would be 100 μm. Then, a copper foil having a thickness of 35 μm was bonded, followed by heating to thermally cure the insulating layer, to obtain a metal base board having a chloride ion concentration of at most 300 ppm, based on the entire thermosetting resin in the insulating layer and a sodium ion concentration of at most 50 ppm, based on the entire inorganic filler in the insulating layer.

With respect to the metal base board, predetermined positions were masked with an etching resist, and the copper foil was subjected to etching. Then, the etching resist was removed to form a circuit thereby to obtain a metal base circuit board.

For the heat conductive adhesive tape, 10 mass % of acrylic acid ("AA", manufactured by TOAGOSEI CO., LTD.) was mixed to 90 mass % of 2-ethylhexyl acrylate ("2EHA", manufactured by TOAGOSEI CO., LTD.) having 10 mass % of acryl rubber ("AR-53L", manufactured by ZEON CORPORATION) dissolved, and 0.5 mass % of photopolymerization initiator 2,2-dimethoxy-1,2-diphenylethan-1-one (manufactured by Ciba Specialty Chemicals), 0.2 mass % of triethylene glycol dimercaptan (manufactured by Maruzen Chemical) and 0.2 mass % of 2-butyl-2-ethyl-1,3-propanediol diacrylate (manufactured by KYOEISHA CHEMICAL CO., LTD.) were further added and mixed to obtain a resin composition.

To the above resin composition, 300 parts by mass of aluminum oxide ("DAW-10", manufactured by Denki Kagaku Kogyo Kabushiki Kaisha) was incorporated, mixed and dispersed to obtain a heat conductive resin composition.

The heat conductive resin composition was subjected to defoaming treatment and applied on a polyester film having a thickness of 75 μm and having release treatment applied to the surface, so that the thickness would be 100 μm, and a polyester film having release treatment applied to the surface was put thereon. Then, from the front and rear sides, ultraviolet rays of 365 nm were applied at 3,000 mJ/cm², to obtain a heat conductive adhesive tape.

To predetermined positions of the conductive circuit of the metal base circuit board, cream solder ("M705", manufactured by Senju Metal Industry Co., Ltd.) was applied by screen printing, and LED ("NFSW036AT", manufactured Nichia Corporation) was mounted by solder reflow. Thereafter, the side of the metal base circuit board on which no LED was mounted, was fixed to a U-shaped case by means of a heat conductive adhesive tape having a heat conductivity of 1 W/mK and a thickness of 100 μm, to obtain a LED light source unit.

In an environment at a temperature of 23° C. under a humidity of 30%, a stabilized power source was connected to the obtained LED light source unit, and LED was illuminated by conducting an electric current of 450 mA. The voltage at that time was 11.8 V. The temperature of the illuminated LED was measured by a thermocouple, whereby the temperature of LED was 45° C.

By the following methods, (1) bendability at room temperature, (2) heat conductivity of insulating layer, (3) heat conductivity of heat conductive adhesive tape, (4) presence or absence of cracking in insulating layer when fixed to U-shaped case at room temperature and (5) LED temperature during the illumination of LED, were measured.

(1) Bendability at Room Temperature

The metal base circuit board was processed into 10 mm×100 mm, and in a temperature atmosphere of 25±1° C., one capable of being bent at an angle of at least 90° with a radius of curvature of 5 mm to the conductive circuit-formed surface side and the side opposite to the conductive circuit-formed surface by both hands, was regarded as "Good", and a case where it was required to use e.g. a bending die and a press machine at the time of carrying out the bending, was regarded as "No good".

(2) Heat Conductivity of Insulating Layer

The metal foil and the conductive circuit of the metal base circuit board were removed, and the insulating layer was processed into 10 mm in diameter×100 mm in thickness, and the heat conductivity was obtained by a laser flash method.

(3) Heat Conductivity of Heat Conductive Adhesive Tape

A sample to be measured was laminated so that the thickness would be 10 mm and processed into 50 mm×120 mm, and the heat conductivity was obtained by a quick thermal conductivity meter (QTM-500, manufactured by Kyoto Electronics Industry Co., Ltd.).

(4) Presence or Absence of Cracking in Insulating Layer

The presence or absence of cracking in the insulating layer in a state bent at 90° at room temperature, was visually observed.

(5) Led Temperature During the Illumination of LED

A rated current of 450 mA was applied to LED to illuminate LED, and upon expiration of 15 minutes, the temperature at the solder joint portion of LED was measured.

TABLE 4-1

| | Heat conductivity of insulating layer (W/mK) | Heat conductivity of adhesive tape (W/mK) | Presence or absence of cracking in insulating layer when fixed to U-shape case | LED temperature at the time of illumination of LED (° C.) |
|---|---|---|---|---|
| Example 4-1 | 2.0 | 1.0 | Absent | 45 |
| Example 4-2 | 4.0 | 1.0 | Absent | 42 |
| Example 4-3 | 2.0 | 2.0 | Absent | 42 |
| Example 4-4 | 4.0 | 2.0 | Absent | 38 |
| Comparative Example 4-1 | 0.2 | 0.2 | Absent | 65 |
| Comparative Example 4-2 | 2.0 | 0.2 | Absent | 55 |

Example 4-2

To 100 parts by mass of an epoxy resin comprising 70 mass % of a 170 ppm hydrogenated bisphenol A epoxy resin having an epoxy equivalent of 207 ("EXA-7015", manufactured by Dainippon Ink and Chemicals Incorporated) and 30 mass % of a hydrogenated bisphenol A epoxy resin having an epoxy equivalent of 1,200 ("YL-7170", manufactured by Japan Epoxy Resins Co., Ltd.), 48 parts by mass of a polyoxypropylenediamine (mass ratio of "D-400" to "D-2000" was 6:4, manufactured by HARTZMAN) was added as a curing agent, and spherical coarse particles of aluminum oxide having a maximum particle size of at most 75 μm, an average particle size of 21 μm and a sodium ion concentration of 10 ppm ("CB-A20", manufactured by Showa Denko K.K.) and spherical fine particles of aluminum oxide having an average particle size of 0.7 μm and a sodium ion concentration of 8 ppm ("AKP-15, manufactured by Sumitomo Chemical Co., Ltd.) were blended so that the total amount would be 66 vol % in an insulating layer (mass ratio of spherical coarse particles to spherical fine particles was 7:3), and an insulating layer was formed on a copper foil having a thickness of 35 μm, so that the thickness after curing would be 100 μm. Then, a copper foil having a thickness of 35 μm was bonded, followed by heating to thermally cure the insulating layer, thereby to obtain a metal base board having a chloride ion concentration of at most 300 ppm, based on the entire thermosetting resin in the insulating layer and a sodium ion concentration of at most 60 ppm, based on the entire inorganic filler in the insulating layer.

With respect to the metal base board, predetermined positions on the copper foil surface on one side were masked with an etching resist, and the copper foil was subjected to etching. Then, the etching resist was removed to form a circuit thereby to obtain a metal base circuit board.

To predetermined positions of the conductive circuit of the metal base circuit board, a cream solder ("M705", manufactured by Senju Metal Industry Co., Ltd.) was applied by screen printing, and LED ("NFSW036AT", manufactured Nichia Corporation) was mounted by solder reflow. Thereafter, the side of the metal base circuit board on which no LED was mounted, was fixed to a U-shaped case by means of a heat conductive adhesive tape obtained in Example 4-1 and having a heat conductivity of 1 W/mK and a thickness of 100 μm, to obtain a LED light source unit.

In an environment at a temperature of 23° C. under a humidity of 30%, a stabilized power source was connected to the obtained LED light source unit, and LED was illuminated by conducting an electric current of 450 mA. The voltage at that time was 11.7 V. The temperature of the illuminated LED was measured by a thermocouple, whereby the temperature of LED was 43° C. The results are shown in Table 4-1. Due to an improvement in the heat conductivity of the insulating layer, the temperature of the illuminated LED became low. Other physical properties were also good.

Example 4-3

To 100 parts by mass of an epoxy resin comprising 70 mass %, based on the entire epoxy resin, of a hydrogenated bisphenol A epoxy resin having an epoxy equivalent of 207 ("EXA-7015", manufactured by Dainippon Ink and Chemicals Incorporated) and 30 mass % of a hydrogenated bisphenol A epoxy resin having an epoxy equivalent of 1,200 ("YL-7170", manufactured by Japan Epoxy Resins Co., Ltd.), 48 parts by mass of a polyoxypropylenediamine (mass ratio of "D-400" to "D-2000" was 6:4, manufactured by HARTZMAN) was added as a curing agent, and spherical coarse particles of aluminum oxide having a maximum particle size of at most 75 μm, an average particle size of 21 μm and a sodium ion concentration of 10 ppm ("CB-A20", manufactured by Showa Denko K.K.) and spherical fine particles of aluminum oxide having an average particle size of 0.7 μm and a sodium ion concentration of 8 ppm ("AKP-15, manufactured by Sumitomo Chemical Co., Ltd.) were blended so that the total amount would be 50 vol % in an insulating layer (mass ratio of spherical coarse particles to spherical fine particles was 7:3), and an insulating layer was formed on a copper foil having a thickness of 35 μm, so that the thickness after curing would be 100 μm. Then, a copper foil having a thickness of 35 μm was bonded, followed by heating to thermally cure the insulating layer, to obtain a metal base board having a chloride ion concentration of at most 300 ppm, based on the entire thermosetting resin in the insulating layer and a sodium ion concentration of at most 50 ppm, based on the entire inorganic filler in the insulating layer.

With respect to the metal base board, predetermined positions were masked with an etching resist, and the copper foil was subjected to etching. Then, the etching resist was removed to form a circuit, thereby to obtain a metal base circuit board.

To predetermined positions of the conductive circuit of the metal base circuit board, a cream solder ("M705", manufactured by Senju Metal Industry Co., Ltd.) was applied by screen printing, and LED ("NFSW036AT", manufactured Nichia Corporation) was mounted by solder reflow. Thereafter, the side of the metal base circuit is board on which no LED was mounted, was fixed to a U-shaped case by means of a heat conductive adhesive tape having a heat conductivity of 2 W/mK and a thickness of 100 μm, which will be described below, to obtain a LED light source unit.

The resin composition of the heat conductive adhesive tape was the composition obtained in Example 4-1 except that 400 parts by mass of aluminum oxide ("DAW-10", manufactured by Denki Kagaku Kogyo Kabushiki Kaisha) was incorporated, and it was prepared in accordance with the procedure shown in Example 4-1.

In an environment at a temperature of 23° C. under a relative humidity of 30%, a stabilized power source was connected to the obtained LED light source unit, and LED was illuminated by conducting an electric current of 450 mA. The voltage at that time was 11.7 V. The temperature of the illuminated LED was measured by a thermocouple, whereby the temperature of LED was 42° C.

Example 4-4

To 100 parts by mass of an epoxy resin comprising 70 mass % of a 170 ppm hydrogenated bisphenol A epoxy resin having an epoxy equivalent of 207 ("EXA-7015", manufactured by Dainippon Ink and Chemicals Incorporated) and 30 mass % of a hydrogenated bisphenol A epoxy resin having an epoxy equivalent of 1,200 ("YL-7170", manufactured by Japan Epoxy Resins Co., Ltd.), 48 parts by mass of a polyoxypropylenediamine (mass ratio of "D-400" to "D-2000" was 6:4, manufactured by HARTZMAN) was added as a curing agent, and spherical coarse particles of aluminum oxide having a maximum particle size of at most 75 μm, an average particle size of 21 μm and a sodium ion concentration of 10 ppm ("CB-A20", manufactured by Showa Denko K.K.) and spherical fine particles of aluminum oxide having an average particle size of 0.7 μm and a sodium ion concentration of 8 ppm ("AKP-15, manufactured by Sumitomo Chemical Co., Ltd.) were blended so that the total amount would be 66 vol % in an insulating layer (mass ratio of spherical coarse particles to spherical fine particles was 7:3), and an insulating layer was formed on a copper foil having a thickness of 35 μm, so that the thickness after curing would be 100 μm. Then, a copper foil having a thickness of 35 μm was bonded, followed by heating to thermally cure the insulating layer, thereby to obtain a metal base board having a chloride ion concentration of at most 300 ppm, based on the entire thermosetting resin in the insulating layer and a sodium ion concentration of at most 60 ppm, based on the entire inorganic filler in the insulating layer.

With respect to the metal base board, predetermined positions on the copper foil surface on one side were masked with an etching resist, and the copper foil was subjected to etching. Then, the etching resist was removed to form a circuit, thereby to obtain a metal base circuit board.

To predetermined positions of the conductive circuit of the metal base circuit board, a cream solder ("M705", manufactured by Senju Metal Industry Co., Ltd.) was applied by screen printing, and LED ("NFSW036AT", manufactured Nichia Corporation) was mounted by solder reflow. Thereafter, the side of the metal base circuit board on which no LED was mounted, was fixed to a U-shaped case by means of a heat conductive adhesive tape obtained in Example 4-3 and having a heat conductivity of 2 W/mK and a thickness of 100 μm, to obtain a LED light source unit.

In an environment at a temperature of 23° C. under a humidity of 30%, a stabilized power source was connected to the obtained LED light source unit, and LED was illuminated by conducting an electric current of 450 mA. The voltage at that time was 11.6 V. The temperature of the illuminated LED was measured by a thermocouple, whereby the temperature of LED was 38° C. The results are shown in Table 4-1. By an improvement in the heat conductivity of the insulating layer, the temperature of the illuminated LED became low. Other physical properties were also good.

Comparative Example 4-1

With respect to a polyimide type flexible board ("R-F775", manufactured by Matsushita Electric Works, Ltd.) having a copper foil having a thickness of 35 μm formed via a polyimide film type insulating layer having a thickness of 50 μm, on a copper foil having a thickness of 35 μm, predetermined positions on the copper foil surface on one side were masked with an etching resist, and the copper foil was subjected to etching. Then, the etching resist was removed to form a circuit thereby to obtain a metal base circuit board.

To predetermined position of the conductive circuit of the metal base circuit board, a cream solder ("M705", manufactured by Senju Metal Industry Co., Ltd.) was applied by screen printing, and LED ("NFSW036AT", manufactured Nichia Corporation) was mounted by solder reflow. Thereafter, the side of the metal base circuit board on which no LED was mounted, was fixed to a U-shaped case by means of an adhesive tape having a thickness of 125 μm ("F-9469PC", manufactured by Sumitomo 3M) to obtain a LED light source unit.

In an environment at a temperature of 23° C. under a humidity of 30%, a stabilized power source was connected to the obtained LED light source unit, and LED was illuminated by conducting an electric current of 450 mA. The voltage at that time was 12.5 V. The temperature of the illuminated LED was measured by a thermocouple, whereby the temperature of LED was 65° C.

Comparative Example 4-2

To 100 parts by mass of an epoxy resin comprising 70 mass %, based on the entire epoxy resin, of a hydrogenated bisphenol A epoxy resin having an epoxy equivalent of 207 ("EXA-7015", manufactured by Dainippon Ink and Chemicals Incorporated) and 30 mass % of a hydrogenated bisphenol A epoxy resin having an epoxy equivalent of 1,200 ("YL-7170", manufactured by Japan Epoxy Resins Co., Ltd.), 48 parts by mass of a polyoxypropylenediamine (mass ratio of "D-400" to "D-2000" was 6:4, manufactured by HARTZMAN) was added as a curing agent, and spherical coarse particles of aluminum oxide having a maximum particle size of at most 75 μm, an average particle size of 21 μm and a sodium ion concentration of 10 ppm ("CB-A20", manufactured by Showa Denko K.K.) and spherical fine particles of aluminum oxide having an average particle size of 0.7 μm and a sodium ion concentration of 8 ppm ("AKP-15", manufactured by Sumitomo Chemical Co., Ltd.) were blended so that the total amount would be 50 vol % in an insulating layer (mass ratio of spherical coarse particles to spherical fine particles was 7:3), and an insulating layer was formed on a copper foil having a thickness of 35 μm, so that the thickness after curing would be 100 μm. Then, a copper foil having a thickness of 35 μm was bonded, followed by heating to thermally cure the insulating layer, thereby to obtain a metal base board having a chloride ion concentration of at most 300 ppm, based on the entire thermosetting resin in the insulating layer and a sodium ion concentration of at most 50 ppm, based on the entire inorganic filler in the insulating layer.

With respect to the metal base board, predetermined positions were masked with an etching resist, and the copper foil was subjected to etching. Then, the etching resist was removed to form a circuit, thereby to obtain a metal base circuit board.

To predetermined position of the conductive circuit of the metal base circuit board, a cream solder ("M705", manufactured by Senju Metal Industry Co., Ltd.) was applied by screen printing, and LED ("NFSW036AT", manufactured Nichia Corporation) was mounted by solder reflow. Thereafter, the side of the metal base circuit board where no LED was mounted, was fixed to a U-shaped case by means of an adhesive tape having a thickness of 125 μm ("F-9469PC", manufactured by Sumitomo 3M) to obtain a LED light source unit.

In an environment at a temperature of 23° C. under a humidity of 30%, a stabilized power source was connected to the obtained LED light source unit, and LED was illuminated by conducting an electric current of 450 mA. The voltage at that time was 11.2 V. The temperature of the illuminated LED was measured by a thermocouple, whereby the temperature of LED was 55° C.

INDUSTRIAL APPLICABILITY

The metal base circuit board of the present invention has heat dissipation properties and electrical insulating properties and yet can be easily bent at room temperature even in such a state that an electrical component such as a semiconductor element or resistance chip which requires heat dissipation, is mounted. Thus, it becomes possible to reduce the size or thickness of an electronic equipment having a high heat generating electronic component mounted, which used to be difficult to attain.

Namely, the metal base circuit board of the present invention is applicable in various application fields, such as an application to a hybrid integrated circuit wherein the circuit board is in contact with a heat dissipation member or a case having a complicated shape, a LED module having a coverlay bonded and a slit processing applied at a desired position to thereby secure bendability or having a layer having a magnetic loss or a layer having a dielectric loss formed, or a LED light source unit having a characteristics of brightness and long useful life, whereby heat generated from a LED light source is efficiently dissipated to the rear side of the board to minimize an increase of the temperature of LED and to suppress deterioration of the light emission efficiency of LED.

The entire disclosures of Japanese Patent Application No. 2005-120891 filed on Apr. 19, 2005, Japanese Patent Application No. 2006-013289 filed on Jan. 23, 2006, Japanese Patent Application No. 2006-030024 filed on Feb. 7, 2006 and Japanese Patent Application No. 2006-87688 filed on Mar. 28, 2006 including specifications, claims, drawings and summaries are incorporated herein by reference in their entireties.

The invention claimed is:

1. A metal base circuit board having an insulating layer and a conductive circuit or metal foil alternately laminated, characterized in that the thickness of the conductive circuit or metal foil is from 5 μm to 450 μm, the insulating layer is made of a cured product of a resin composition comprising an inorganic filler and a thermosetting resin, and the thickness of the insulating layer is from 9 μm to 300 μm, wherein the insulating layer is a cured product of a resin composition comprising from 25 to 60 vol % of the thermosetting resin and the rest being the inorganic filler having a sodium ion concentration of at most 500 ppm and comprising spherical coarse particles having the maximum particle size of at most 75 um and an average particle size of from 5 to 40 μm and spherical fine particles having an average particle size of from 0.3 to 3.0 μm.

2. The metal base circuit board according to claim 1, wherein at least one through-hole to be used for electrically connecting conductive circuits or metal foils, is at least 0.0078 mm$^2$.

3. The metal base circuit board according to claim 1, wherein the thermal conductivity of the insulating layer is from 1 to 4 W/mK.

4. The metal base circuit board according to claim 1, wherein the glass transition temperature of the insulating layer is from 0 to 40° C.

5. The metal base circuit board according to claim 1, wherein the thermosetting resin comprises a hydrogenated bisphenol F, A epoxy resin or a combination thereof.

6. The metal base circuit board according to claim 5, wherein the thermosetting resin comprises a straight-chain epoxy resin having an epoxy equivalent of from 800 to 4,000.

7. The metal base circuit board according to claim 5, wherein the thermosetting resin contains a polyoxyalkylene polyamine as a curing agent.

8. The metal base circuit board according to claim 5, wherein the chloride ion concentration in the thermosetting resin is at most 500 ppm.

9. The metal base circuit board according to claim 1, wherein when the circuit board is bent at an optional portion at an angle of at least 90° with a radius of curvature of from 1 to 5 mm, the withstand voltage between conductive circuits or metal foils is at least 1.0 kV.

10. The metal base circuit board according to claim 1, wherein a conductive circuit is formed on a metal foil via an insulating layer, and a coverlay having a thickness of from 5 μm to 25 μm is further formed, and wherein at least a part of the coverlay is removed to form a slit at a portion where the conductive circuit is not formed.

11. The metal base circuit board according to claim 10, wherein the slit is formed to have a length corresponding to from 50% to 95% of the length of the portion to be bent.

12. The metal base circuit board according to claim 10, wherein the thickness of the coverlay is from 5 μm to 25 μm.

13. The metal base circuit board according to claim 10, which is bent along the slit.

14. The metal base circuit board according to claim 10, wherein the insulating layer surface is bent at an angle of at least 90° with a radius of curvature of from 0.1 to 0.5 mm.

15. The metal base circuit board according to claim 10, wherein a layer having a magnetic loss or a layer having a dielectric loss is laminated on the surface of the coverlay.

16. The metal base circuit board according to claim 10, wherein the layer having a magnetic loss comprises a magnetic material having an aspect ratio of at least 2, and an organic binder, the content of the magnetic material is from 30 to 70 vol %, and the thickness of the layer having a magnetic loss is from 3 μm to 50 μm.

17. The metal base circuit board according to claim 10, wherein the layer having a magnetic loss comprises a carbon powder having a specific surface area of from 20 to 110 m2/g, and an organic binder, the content of the carbon powder is from 5 to 60 vol %, and the thickness of the layer having a magnetic loss is from 3 μm to 50 μm.

18. A hybrid integrated circuit using the metal base circuit board as defined in claim 1.

19. A light-emitting diode having at least one light-emitting diode electrically connected to the conductive circuit of the metal base circuit board as defined in claim 10.

20. A LED light source unit having the metal base circuit board as defined in claim 1 disposed on a surface of a case via an adhesive tape and having at least one light-emitting diode (LED) mounted on the conductive circuit of the metal base circuit board.

21. The LED light source unit according to claim 20, wherein the adhesive tape has a thermal conductivity of from 1 to 2 W/mK and a thickness of from 50 μm to 150 μm.

22. The LED light source unit according to claim 20, wherein the adhesive tape comprises a polymer comprising acrylic acid, and/or methacrylic acid or a combination thereof.

23. The LED light source unit according to claim 20, wherein the adhesive tape contains a heat-conductive electrically insulating agent in an amount of from 40 to 80 vol %.

24. The LED light source unit according to claim 20, wherein the heat-conductive electrically insulating agent has the maximum particle size of at most 45 μm and an average particle size of from 0.5 to 30 μm.

* * * * *